(12) United States Patent
Joung et al.

(10) Patent No.: US 11,730,013 B2
(45) Date of Patent: Aug. 15, 2023

(54) DISPLAY PANEL AND HEAD MOUNTED DISPLAY DEVICE INCLUDING THE SAME

(71) Applicant: LG Display Co., Ltd., Seoul (KR)

(72) Inventors: Seung-Ryong Joung, Seoul (KR); Hong-Seok Choi, Seoul (KR); Yoon-Deok Han, Yongin-si (KR); Gyeong-Woo Kim, Seoul (KR); Jun-Ho Lee, Seoul (KR); Ji-Seon Jang, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 336 days.

(21) Appl. No.: 16/999,925

(22) Filed: Aug. 21, 2020

(65) Prior Publication Data

US 2021/0066663 A1    Mar. 4, 2021

(30) Foreign Application Priority Data

Aug. 26, 2019  (KR) ........................ 10-2019-0104511

(51) Int. Cl.
| | | |
|---|---|---|
| G06F 1/16 | (2006.01) |
| G02B 5/00 | (2006.01) |
| H10K 50/852 | (2023.01) |
| G02B 27/01 | (2006.01) |
| H10K 50/13 | (2023.01) |
| H10K 59/30 | (2023.01) |
| H10K 59/38 | (2023.01) |
| H10K 59/123 | (2023.01) |

(52) U.S. Cl.
CPC ....... *H10K 50/852* (2023.02); *G02B 27/0172* (2013.01); *H10K 50/131* (2023.02); *H10K 59/123* (2023.02); *H10K 59/30* (2023.02); *H10K 59/38* (2023.02); *G02B 2027/0112* (2013.01); *G02B 2027/0178* (2013.01); *G06F 1/163* (2013.01)

(58) Field of Classification Search
CPC ............. H01L 51/5265; H01L 27/3206; H01L 27/322; H01L 27/3248; H01L 51/5044; G02B 27/0172; G02B 2027/0112; G02B 2027/0178; G02B 5/201; G02B 5/288; G02B 5/20; G02B 6/0055; G06F 1/163; H10K 50/852; H10K 50/131; H10K 59/123; H10K 59/30; H10K 59/38; H10K 59/122
See application file for complete search history.

(56) References Cited

U.S. PATENT DOCUMENTS

| | | | | |
|---|---|---|---|---|
| 10,365,490 B2 * | 7/2019 | Hayashi | ................... | G09G 5/02 |
| 10,674,141 B1 * | 6/2020 | Zhang | .................... | G02B 7/003 |
| 2009/0051284 A1 * | 2/2009 | Cok | ....... | H01L 27/322 |
| | | | | 313/506 |

(Continued)

FOREIGN PATENT DOCUMENTS

| | | |
|---|---|---|
| KR | 10-1400058 B1 | 5/2014 |
| KR | 10-1520489 B1 | 5/2015 |

*Primary Examiner* — Pegeman Karimi
(74) *Attorney, Agent, or Firm* — Fenwick & West LLP

(57) ABSTRACT

Disclosed is a display panel configured such that, in a structure in which the distance between a display surface and a viewer is short, the structure between a reflective plate and a first electrode (an anode) is changed such that light having three or more color peak properties for all subpixels is transmitted through a second electrode (a cathode), whereby white expression as well as color expression is possible, and a head mounted display device including the same.

19 Claims, 15 Drawing Sheets

(56) References Cited

U.S. PATENT DOCUMENTS

| | | | | |
|---|---|---|---|---|
| 2009/0102352 A1* | 4/2009 | Cok | ................... | H01L 51/5265 |
| | | | | 445/35 |
| 2014/0159021 A1* | 6/2014 | Song | ................... | H01L 51/5265 |
| | | | | 257/40 |
| 2019/0131556 A1* | 5/2019 | Kim | ................... | H01L 51/5072 |
| 2019/0172873 A1* | 6/2019 | Ji | ....................... | H01L 51/5206 |
| 2019/0189969 A1* | 6/2019 | Youn | ................... | H01L 27/3223 |

* cited by examiner

DISPLAY PANEL AND HEAD MOUNTED DISPLAY DEVICE INCLUDING THE SAME

CROSS-REFERENCE TO RELATED APPLICATION

This application claims the benefit of Republic of Korea Patent Application No. 10-2019-0104511, filed on Aug. 26, 2019, which is hereby incorporated by reference in its entirety.

BACKGROUND

Field of Technology

The present disclosure relates to a display device, and more particularly to a display panel capable of enhancing each color wavelength in an inner organic light-emitting stack in order to obtain a white spectrum with improved balance in a structure in which the distance between a display surface and a viewer is short and a head mounted display device including the same.

Discussion of the Related Art

With recent entry into a full-scale information age, a display field capable of visually expressing an electrical information signal has rapidly grown, and in response thereto, various flat display devices having excellent performance, such as slimness, light weight, and low power consumption, have been developed and rapidly replaced a conventional cathode ray tube (CRT).

Representative examples of such flat display devices may include a liquid crystal display (LCD) device, a plasma display panel (PDP) device, a field emission display (FED) device, an organic light-emitting display (OLED) device, and a quantum dot display device.

Thereamong, a self-emissive display device, such as an organic light-emitting display device, which does not require a separate light source, is compact, and is capable of displaying vivid colors, is preferred.

Meanwhile, as the range of a field using a display device gradually extends, the display device may be applied as a mounted form or a wearable form in which a viewer can mount or wear the display device such that the display device can be moved together with the viewer in addition to a monitor or a television.

Since such a mounted or wearable display device is different in viewing angle, luminance, and disposition density from a large-sized display device, however, it is necessary to develop a device structure different from a flat display device, such as a general monitor or television, for high integration and high luminance.

SUMMARY

Accordingly, the present disclosure is directed to a display panel and a head mounted display device including the same that substantially obviate one or more problems due to limitations and disadvantages of the related art.

An object of the present disclosure is to provide a display panel configured such that, in a structure in which the distance between a display surface and a viewer is short and thus high resolution is required, the structure between a reflective plate and a first electrode (an anode) is changed, whereby white expression as well as color expression is possible in an inner organic light-emitting stack, and a head mounted display device including the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The present disclosure relates to a display panel configured such that, in a structure in which the distance between a display surface and a viewer is short, the structure between a reflective plate and a first electrode (an anode) is changed such that light having three or more color peak properties for all subpixels is transmitted through a second electrode (a cathode), whereby white expression as well as color expression is possible, and a head mounted display device including the same.

To achieve these objects and other advantages and in accordance with the purpose of the invention, as embodied and broadly described herein, a display panel includes a substrate having a plurality of subpixels, a reflective plate provided on the substrate, a color compensation layer provided on the reflective plate, a first electrode provided on the color compensation layer for each of the subpixels, a second electrode provided above the first electrode, a white organic light-emitting stack provided between the first electrode and the second electrode, the white organic light-emitting stack including emissive layers configured to emit at least different colors of light, and a filter unit and a transmission unit provided on the second electrode, the filter unit being configured to selectively transmit some wavelengths of light, among light emitted through the white organic light-emitting stack, the transmission unit being configured to transmit all wavelengths of light emitted through the white organic light-emitting stack.

In another aspect of the present disclosure, a head mounted display device includes the display panel and a reception structure configured to receive the display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
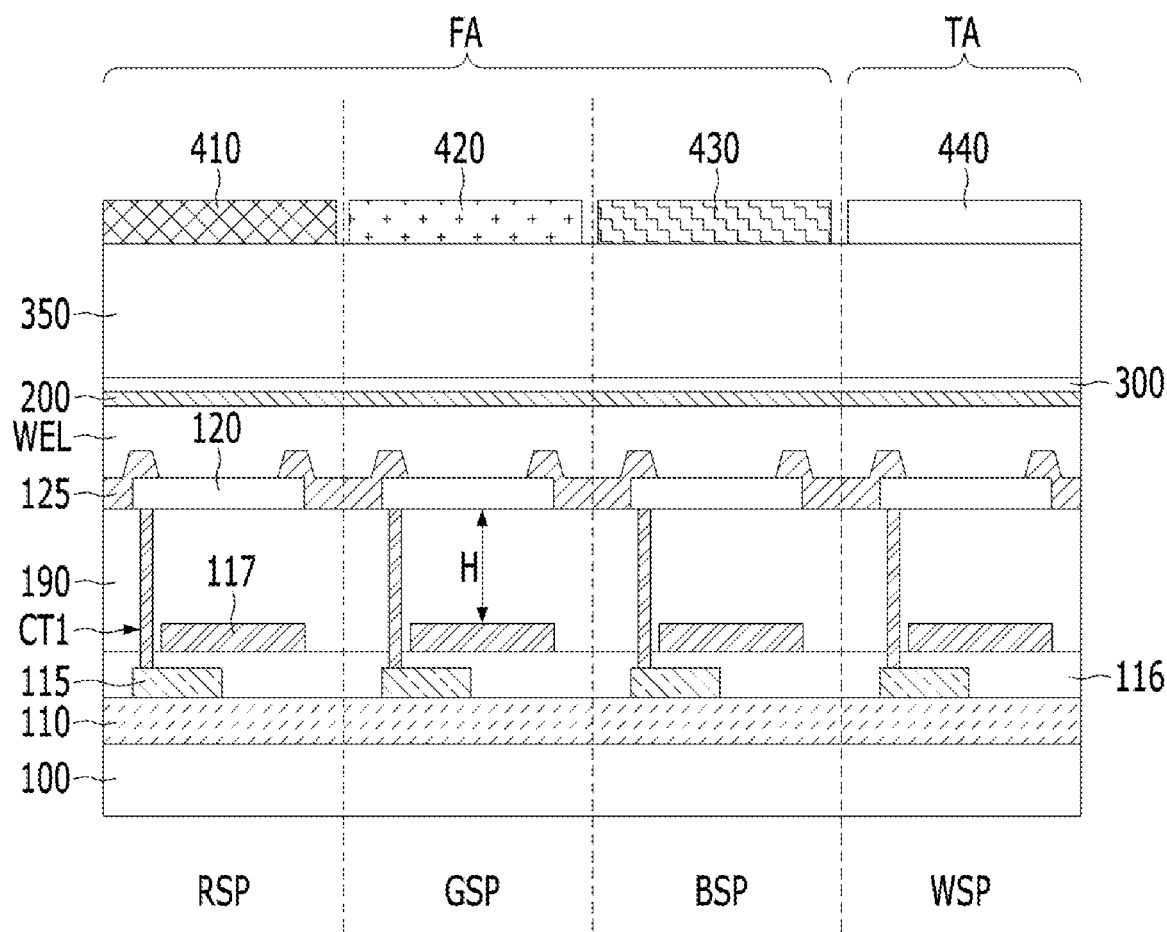
FIG. 1 is a sectional view showing a display panel according to a first embodiment of the present disclosure.

Reference will now be made in detail to the embodiments of the present invention, examples of which are illustrated in the accompanying drawings. Wherever possible, the same reference numbers will be used throughout the drawings to refer to the same or like parts. In the following description of the present invention, a detailed description of known functions and configurations incorporated herein will be omitted when it may obscure the subject matter of the present invention. In addition, the terms used in the following description are selected in consideration of ease of preparation of the specification, and may be different from the names of parts constituting an actual product.

Shapes, sizes, rates, angles, and numbers shown in the drawings to describe the embodiments of the present invention are illustrative and thus are not limitative of the disclosure of the present invention. Wherever possible, the same reference numbers will be used throughout the drawings to refer to the same or like parts. Also, in the following description of the present invention, a detailed description of known technology incorporated herein will be omitted when it may obscure the subject matter of the present invention. In the case in which the terms "comprises," "has," or "includes" are used in this specification, other parts may be further added unless the term "only" is used. The singular forms are intended to include the plural forms as well, unless the context clearly indicates otherwise.

In interpreting components included in various embodiments of the present invention, it is to be interpreted that an error range is included unless the context clearly indicates otherwise.

In explaining various embodiments of the present invention, when a positional relationship is described, for example, when the positional relationship between two parts is described using terms such as "on", "above," "under," "beside," etc., one or more additional parts may be located between the two parts unless the term "immediately" or "directly" is used.

In explaining various embodiments of the present invention, when a temporal relationship is described, for example, when time sequences such as "after," "subsequently," "next," and "before" are described, discontinuous sequences may be included unless the term "immediately" or "directly" is used.

In explaining various embodiments of the present invention, the terms "first," "second," etc. are used to describe various elements. However, these terms are used only to distinguish between the elements. In this specification, therefore, a component identified by "first" may be identical to a component identified by "second" within the technical spirit of the present invention unless the context clearly indicates otherwise.

Features of various embodiments of the present invention may be partially or entirely coupled to or combined with each other, and may be technically interlocked and driven in various manners. Various embodiments may be realized independently or in combination with each other.

First, an organic light-emitting device array and a display panel, among terms described below, will be described.

An organic light-emitting device array described in the present disclosure is an organic light-emitting device array configured to have a structure in which subpixels having a plurality of organic light-emitting devices configured to emit different colors of light are arranged on a substrate in consideration of optical properties, and a display panel according to the present disclosure is a display device configured to have a structure in which a driving thin film transistor is provided for each subpixel in order to drive the organic light-emitting device array by subpixel. Here, the driving thin film transistor is connected to an electrode of the light-emitting device of each subpixel.

In addition, in a head mounted display device according to the present disclosure, display panels are provided so as to correspond to both eyes. The display panels may be provided in a reception structure in the state of being independently divided so as to correspond to a left eye and a right eye.

Hereinafter, the present invention will be described with reference to the drawings.

Figure 2:
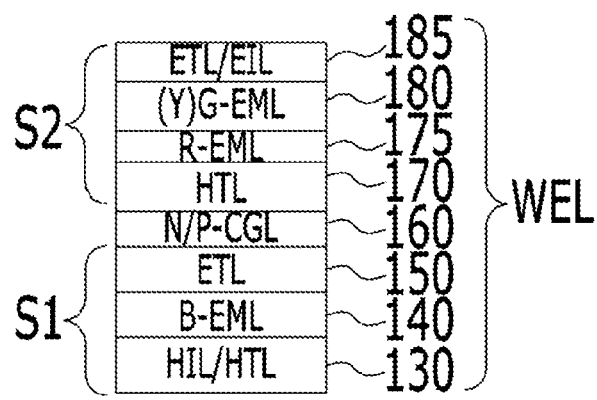
FIG. 2 is a sectional view showing a white organic light-emitting stack of FIG. 1 according to one embodiment of the present disclosure.
Figure 3:
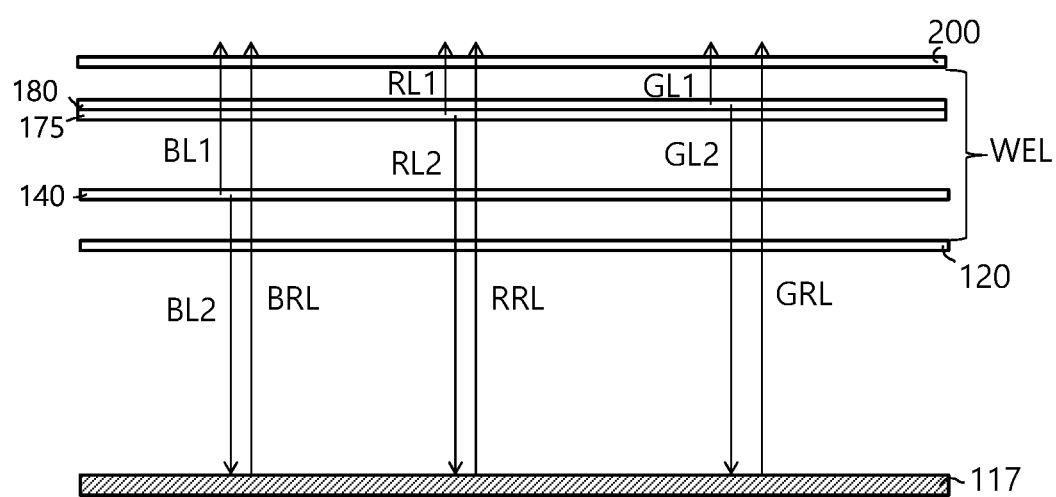
FIG. 3 is a view showing an optical path generated at the white organic light-emitting stack of FIG. 1 and components adjacent thereto according to one embodiment of the present disclosure.
Figure 4:
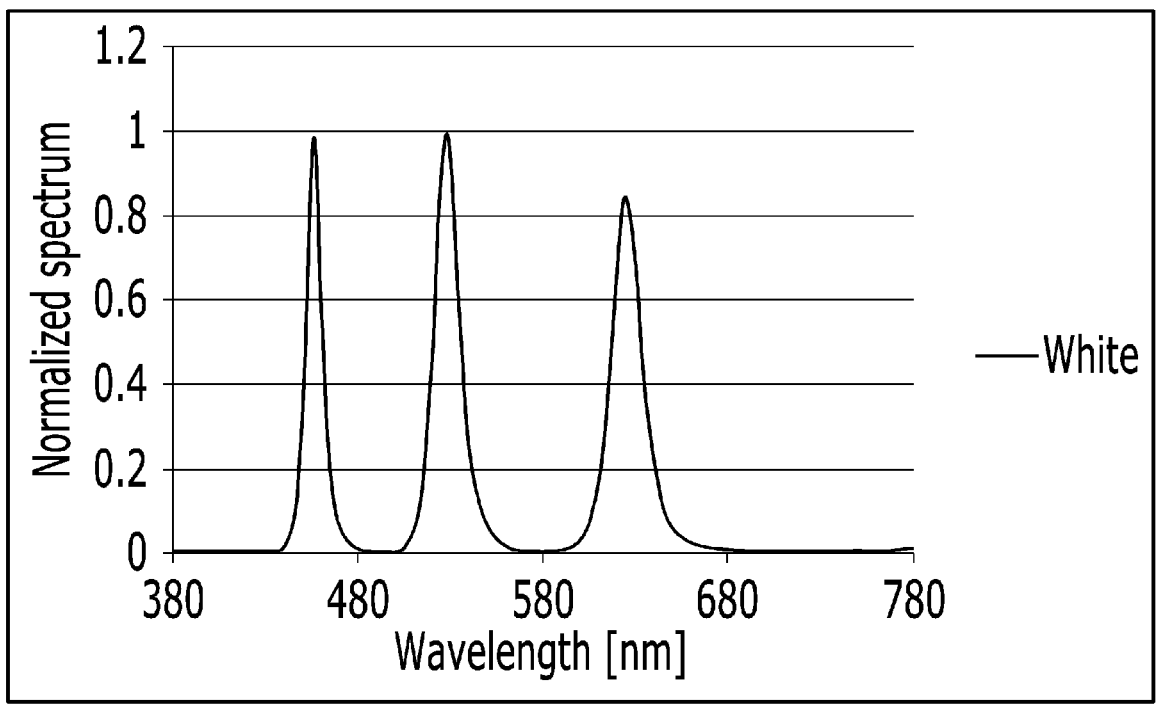
FIG. 4 is a graph showing the spectrum of light transmitted through a second electrode of FIG. 1 according to one embodiment of the present disclosure.
Figure 5:
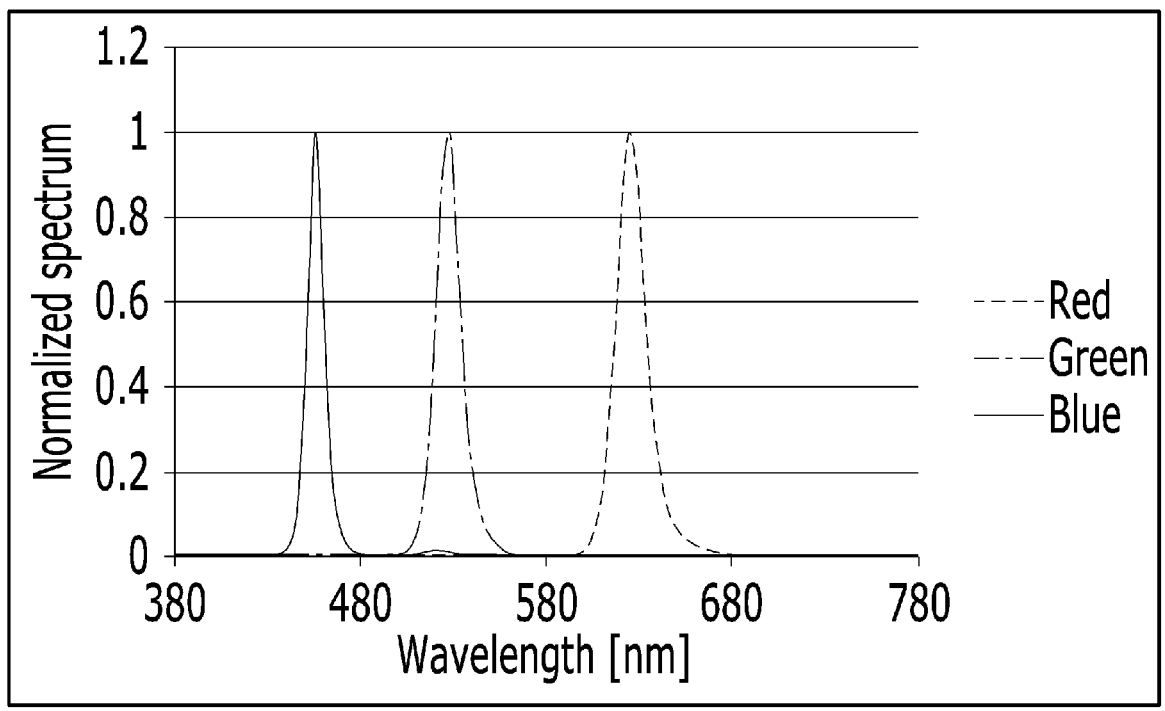
FIG. 5 is a graph showing the spectrum of light transmitted through a color filter layer in red, green, and blue subpixels of FIG. 1 according to one embodiment of the present disclosure.
Figure 6:
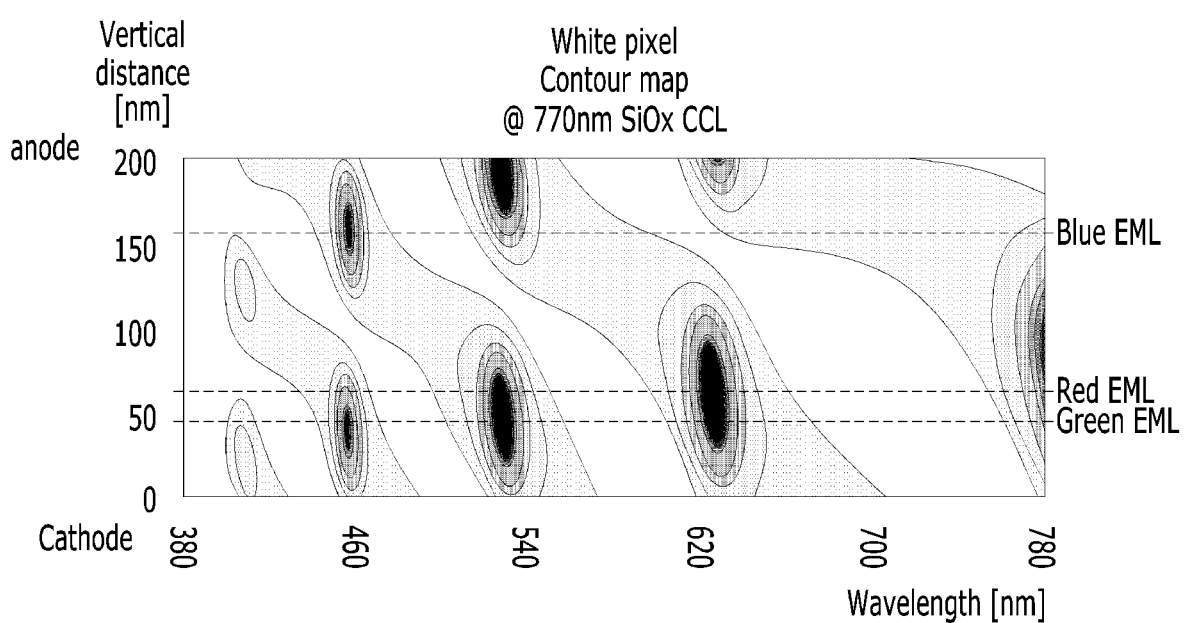
FIG. 6 is a contour map showing light emission properties of light transmitted through the white organic light-emitting stack of FIG. 1 according to a first experimental example.

FIG. 1 is a sectional view showing a display panel according to a first embodiment of the present invention, and FIG. 2 is a sectional view showing a white light-emitting device of FIG. 1. FIG. 3 is a view showing an optical path generated at the white organic light-emitting stack of FIG. 1 and components adjacent thereto, and FIG. 4 is a graph showing the spectrum of light transmitted through a second electrode of FIG. 1. In addition, FIG. 5 is a graph showing the spectrum of light transmitted through a color filter layer in red, green, and blue subpixels of FIG. 1, and FIG. 6 is a contour map showing light emission properties of light transmitted through the white organic light-emitting stack of FIG. 1 according to a first experimental example.

As shown in FIGS. 1 and 2, the display panel according to the present disclosure includes a substrate 100 having a plurality of subpixels RSP, GSP, BSP, and WSP, a reflective plate 117 provided on the substrate 100, a color compensation layer 190 provided on the reflective plate 117, a first electrode 120 provided at each of the subpixels on the color compensation layer 190, a second electrode 200 provided on the first electrode 120, and a white organic light-emitting stack WEL including emissive layers 140, 175, and 180 configured to emit different colors of light between the first electrode 120 and the second electrode 200.

In addition, the display panel according to the first embodiment of the present disclosure includes a filter unit FA configured to selectively transmit some wavelengths of light, among light emitted through the white organic light-emitting stack WEL, on the second electrode 200 and a transmission unit TA configured to transmit all wavelengths of light emitted through the white organic light-emitting stack WEL.

In addition, the display panel may further include a capping layer 300 configured to improve optical efficiency of emitted light and to protect the second electrode 200, including the white organic light-emitting stack WEL, between the layer of the second electrode 200 and the layer of the filter unit FA and the transmission unit TA and an encapsulation layer 350 configured to reduce permeation of moisture or external air into the organic light-emitting stack WEL.

Here, the filter unit FA and the transmission unit TA are located in the same plane, and the upper part of the second electrode 200, i.e. the transmission unit TA, transmits light transmitted from below without optical loss, rather than performing a selective light filter function, whereby spectrum properties of light transmitted from the white organic light-emitting stack WEL may be projected without change.

In the shown example, the filter unit FA and the transmission unit TA are located on the encapsulation layer 350. However, the present disclosure is not limited thereto. Depending on circumstances, the position of the encapsulation layer 350 may be changed, and therefore the encapsulation layer 350 may be located on the filter unit FA and the transmission unit TA. In this case, the filter unit FA and the transmission unit TA abut the capping layer 300, and the encapsulation layer 350 may be located to cover the filter unit FA.

The capping layer 300 may be formed by stacking an organic capping layer and an inorganic capping layer. The organic capping layer may be made of the same material as one of the organic layers included in the white organic light-emitting stack WEL. In addition, the encapsulation layer 350 may be formed by alternating at least one pair of organic and inorganic films.

Each of the organic and inorganic films constituting the encapsulation layer 350 has a thickness twice or more than the thickness of each layer in the structure below the capping layer 300 so as to sufficiently cover the lower structure. In particular, the organic film of the encapsulation layer 350 has a thickness ten times of more than the thickness of each layer in the structure below the capping layer 300 so as to stably cover particles generated during the process or outgassing generated therein and to prevent movement of the particles after covering. In addition, the encapsulation layer 350 optically has little influence on light transmission, and may transmit light in the advancing direction without change. The encapsulation layer 350 has a structure in which the inorganic film and the organic film are alternately disposed, and may be disposed such that the upper part of the encapsulation layer 350 is an inorganic film in a structure having a plurality of pairs or N.5 pairs (N being a natural number). In the encapsulation layer 350, the inorganic film may be, for example, an oxide film, a nitride film, or an oxynitride film, or at least one of the inorganic films may partially include a metal component that exhibits covering force, such as aluminum, such that the inorganic film remains transparent, and the inorganic film may have a thickness of about 1 μm. The organic film may have a thickness of about 10 μm, and may be made of an organic material that is transparent and has foreign matter covering force. In the encapsulation layer 350, the inorganic film is formed so as to be planarly wider than the organic film such that the inorganic film prevents permeation of moisture from outside the encapsulation layer 350.

Here, as shown, the filter unit FA includes a red color filter layer 410, a green color filter layer 420, and a blue color filter layer 430, which may be provided at the red subpixel RSP, the green subpixel GSP, and the blue subpixel BSP, respectively. The filter unit FA has a function of selectively transmitting red, green, and blue light based on the red, green, and blue subpixels RGP, GSP, and BSP with respect to white light emitted from the white organic light-emitting stack WEL.

Figure 10:
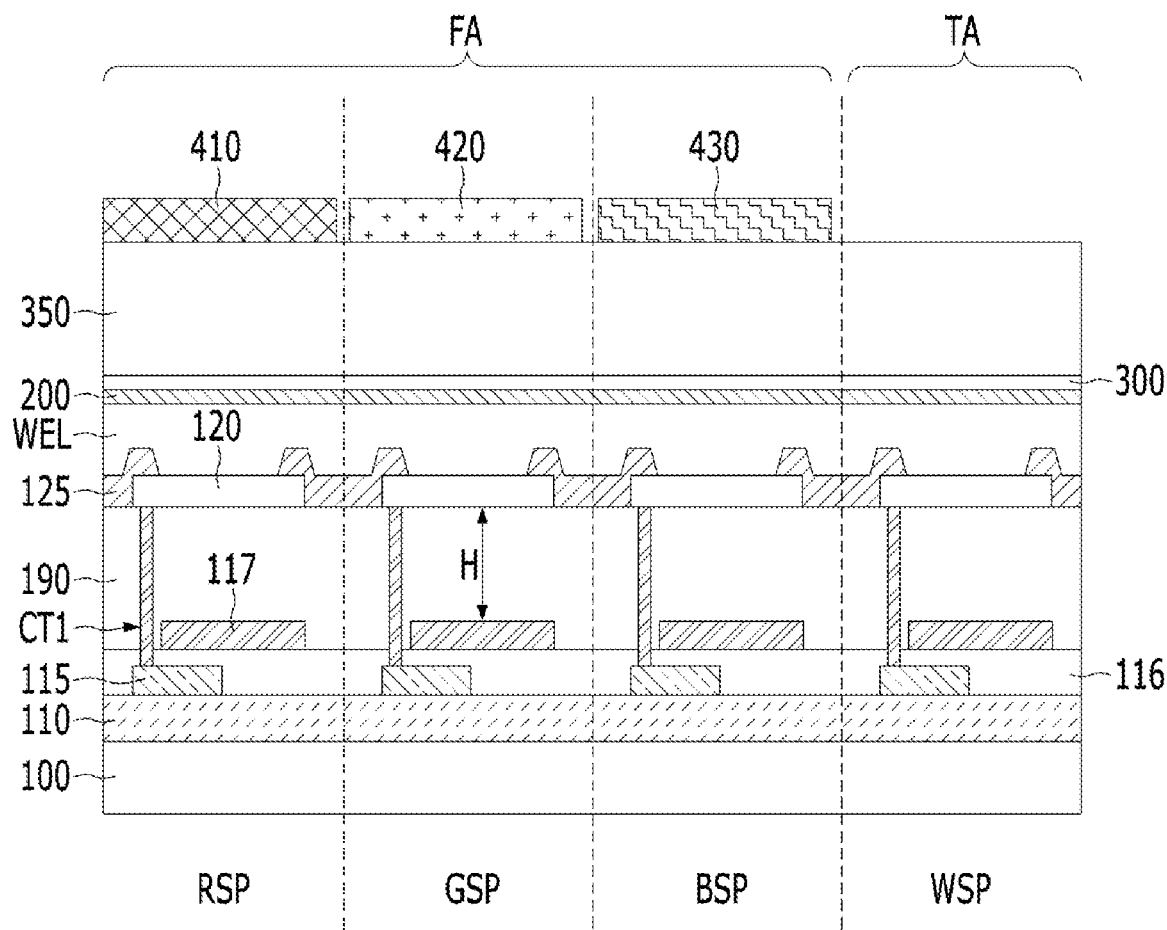
FIG. 10 is a sectional view showing a display panel according to a second embodiment of the present disclosure.

In addition, as shown in FIG. 1, the transmission unit TA may include a single transparent organic film 440, or may be defined by emptying the area without a separate member, unlike the filter unit FA (see FIG. 10). The reason for this is that, in the display panel according to the present disclosure, light emitted from the white organic light-emitting stack WEL through the second electrode 200 has light emission properties distinguished in red, green, and blue, and therefore it is possible to realize a white spectrum having three peak properties at the emission side of the white organic light-emitting stack WEL without a separate optical member.

In the display panel according to the first embodiment of the present disclosure, the transparent organic film 440 in the white subpixel WSP emits light in the state of having the same optical properties without affecting the optical spectrum of the white organic light-emitting stack WEL transmitted from below. Here, the transparent organic film 440 is provided to perform an optical transmission function and to reduce a step with the color filter layers 410, 420, and 430 provided at the filter unit FA. In the case in which a protective film (not shown) configured to uniformly cover the transmission unit TA together with the filter unit FA is further included although the transparent organic film 440 is not provided at the transmission unit TA, the transparent organic film 440 of the transmission unit TA may be omitted. For example, the transparent organic film 440 may be made of polyimide, polyamide, or polyacrylic, and these materials are transparent and have characteristics capable of minimizing optical loss or delay of transmitted light.

Meanwhile, in the display panel according to the present disclosure, light generated in each of the emissive layers 140, 175, and 180 of the white organic light-emitting stack WEL is primarily emitted without directivity. A portion of the light emitted from each of the emissive layers 140, 175, and 180 is directly transmitted through the second electrode 200, and the remainder is repeatedly reflected and re-reflected between the reflective plate 117 and the second electrode 200 and undergoes constructive interference through microscale resonance. As shown in FIG. 4, therefore, light having a microcavity property with respect to red, green, and blue wavelengths is transmitted through the second electrode 200 again.

The optical path of light emitted from the white organic light-emitting stack WEL will be described in more detail. As shown in FIG. 3, the blue emissive layer 140, the red emissive layer 175, and the green emissive layer 180 provided at the white organic light-emitting stack WEL generate first light BL1, RL1, and GL1 directly transmitted to the second electrode 200 and second light BL2, RL2, and GL2 advancing toward the first electrode 120. The second light BL2, RL2, and GL2 is reflected by the surface of the reflective plate 117 and is thus converted into reflected light BRL, RRL, and GRL. The reflected light BRL, RRL, and GRL is repeatedly reflected and re-reflected through microscale resonance between the reflective plate 117 and the second electrode 200, and light that undergoes constructive interference at a specific area of each color wavelength is transmitted through the color compensation layer 190, the first electrode 120, the white organic light-emitting stack WEL, and the second electrode 200.

Here, the first light BL1, RL1, and GL1 of each color wavelength and the reflected light BRL, RRL, and GRL are also transmitted through the second electrode 200 based on a constructive interference relationship at each of the blue, red, and green wavelengths. As shown in FIG. 4, therefore, light finally emitted from the second electrode 200 is distinguished so as to have a microcavity property in red, green, and blue, whereby a white spectrum having three distinctly distinguished peaks is provided. Here, adjustment of the first light BL1, RL1, and GL1 of red, green, and blue emitted through the white organic light-emitting stack WEL and the reflected light BRL, RRL, and GRL so as to have a microcavity property is based on the optical distance between the reflective plate 117 and the first electrode 120. The optical distance is set by the refractive index n and the thickness H of a medium. In the display panel according to the present disclosure, the color compensation layer 190 between the reflective plate 117 and the first electrode 120 is uniformized in order to equalize the optical distances of the subpixels. That is, the material and thickness of the color compensation layer 190 are uniform over all of the subpixels RSP, GSP, BSP, and WSP, and light of white spectrums having the same optical properties, i.e. the distinguished light emission peaks of red, green, and blue, based on the same optical distance at the areas of the red, green, blue, and white subpixels between the reflective plate 117 and the second electrode 200 is emitted. Here, the color compensation layer 190 adjusts the optical distance of the reflected light of each color, the light reflected between the reflective plate 117 and the second electrode 200 undergoes constructive interference, whereby light having a specific range of red, green, and blue wavelengths is emitted. That is, with respect to the thickness between the reflective plate 117 and the second electrode 200, the color compensation layer 190 according to the present disclosure is thicker than any organic layer included in the white organic light-emitting stack WEL, and in one embodiment the total thickness of the white organic light-emitting stack WEL, and microscale resonance wavelengths of red, green, and blue are transmitted from the white organic light-emitting stack WEL to adjust the light resonance effect between the reflective plate 117 and the second electrode 200, and wavelengths within a selected range of red, green, and blue are transmitted through the second electrode 200. Consequently, it is possible to express three-peak white through resonance action by wavelength including reflection and re-reflection using only the construction including the reflective plate, the second electrode, and the color compensation layer and the white organic light-emitting stack therebetween. In this case, no color filter layer is provided on the second electrode 200, and the transmission unit TA is provided as an area configured to transmit light from the white organic light-emitting stack in the state of having three-peak white, whereby it is possible to realize the white subpixel WSP using the transmission unit TA. That is, when light generated in the white organic light-emitting stack WEL between the first electrode 120 and the second electrode 200 is emitted through reflection and re-reflection between the reflective plate 117 below the first electrode 120 and the second electrode 200, the thickness of the color compensation layer 190 between the reflective plate 117 and the second electrode 200 is set such that three different wavelengths undergo constructive interference, whereby it is possible to simultaneously emit white light including three peaks within a visible light range through the transmission unit TA having no filter unit in addition to realization of a selective wavelength of red, green, and blue through the filter unit FA.

In the example shown in FIG. 1, the minimum unit of subpixels to be expressed in the display panel according to the first embodiment of the present disclosure, i.e. a total of four subpixels, such as the red subpixel RSP, the green subpixel GSP, the blue subpixel BSP, and the white subpixel WSP, are shown. The color of transmitted light of each of the red, green, and blue subpixels appears when passing through the final color filter layers 410, 420, and 430 at each subpixel. Before passing through the color filter layers 410, 420, and 430, the light immediately after being transmitted through the white organic light-emitting stack WEL and the second electrode 200 has a white spectrum including a peak property of each of red, green, and blue, as shown in FIG. 4.

Consequently, the white subpixel WSP may exhibit a white light transmission property such that the light intensity of red, green, and blue is almost uniform while being biased to a specific color without the color filter layers 410, 420, and 430. In the display panel according to the first embodiment of the present invention, therefore, it is possible to express white light in addition to expression of red, green, and blue light, thereby providing a luminance improvement effect capable of expressing a larger number of colors.

That is, in the display panel according to the first embodiment of the present invention, the color compensation layer 190 between the reflective plate 117 and the first electrode 120 is formed so as to be thicker than the white organic light-emitting stack WEL, whereby microscale resonance is possible with respect to wavelengths of red, green, and blue, and when the reflected light advancing area is adjusted such that light is emitted through the second electrode, expression of white including three color peaks is possible without filtering at the transmission unit having no color filter, whereby panel efficiency may also be improved.

Also, in the display panel according to the present disclosure and a head mounted display device including the same, the color compensation layer 190 provided between the reflective plate and the first electrode may have the same thickness at different color subpixels and the white subpixel, whereby constructive interference between different wavelengths of light is simultaneously possible. In this case, the color compensation layer does not generate a step for each of the subpixels, whereby a process of forming contact holes CT1 through the color compensation layer between the first electrode 120 and a thin film transistor TFT is unified, whereby it is possible to simplify the process.

Also, in the display panel according to the present disclosure, a step is not generated between areas in the structure below the second electrode 200 at the respective subpixels RSP, GSP, BSP, and WSP. In the construction located above the thin film transistor 115, therefore, the use of a mask necessary to divide the area into the subpixels RSP, GSP, BSP, and WSP is reduced or omitted, whereby it is possible to realize a high-resolution small-sized panel. In particular, when forming the color compensation layer 190, the white organic light-emitting stack WEL, or the second electrode 200, a common mask having an opening is used with respect to all of the subpixels RSP, GSP, BSP, and WSP even when there is an interference phenomenon during a deposition process, the edge of the opening of the common mask is located outside an active area AA including all of the subpixels, whereby each of the subpixels RSP, GSP, BSP, and WSP is not affected by an interference phenomenon due to a deposition material and thus it is possible to realize high resolution with high precision.

Meanwhile, in the present disclosure, red light has a peak wavelength of 600 nm to 650 nm, green light has a peak wavelength of 500 nm to 590 nm, and blue light has a peak wavelength of 435 nm to 475 nm. Here, more strictly, green light may be divided into green light having a peak wavelength of 500 nm to 555 nm and yellow-green light having a peak wavelength of 556 nm to 590 nm.

Meanwhile, in the display panel according to the present disclosure, color light other than white, as colors expressed by the subpixels, is not limited to red, green, and blue, as shown. For example, in the case in which it is possible to realize white through a combination of three different colors, the subpixels provided at the display panel may also be changed to a combination of different colors of subpixels. As an example, the green subpixel may be replaced with a yellow-green (YG) subpixel. In this case, the color filter layer provided above the second electrode 200 of the yellow-green subpixel may be replaced with a yellow-green color filter layer capable of selectively transmitting a yellow-green wavelength. However, the present disclosure is not limited thereto, a color shifted to a short wavelength or a long wavelength may be used with respect to each of red, green, and blue according to necessity of expression on the display panel.

As another example of the display panel according to the present disclosure, even in the case in which subpixels having a combination of other colors are provided, rather than the red, green, and blue subpixels, it is possible to realize a white spectrum having distinctly distinguished peak properties with respect to wavelengths emitting different colors.

Meanwhile, in the example shown in FIG. 1, the red, green, blue, and white subpixels constitute a single pixel, and therefore a single pixel is shown.

The red, green, blue, and white subpixels RSP, GSP, BSP, and WSP may have the same size, and, when it is necessary to express a specific color as needed, the size of a subpixel having the specific color may be changed so as to be greater than the size of subpixels of other colors. The size of each of the subpixels RSP, GSP, BSP, and WSP is not limited to a specific area. In addition, each of the subpixels RSP, GSP, BSP, and WSP may be quadrangular, as shown. However, the present invention is not limited thereto, and each subpixel may have another shape, such as an oval or a circle.

Components of the white organic light-emitting stack WEL will be described in detail. As shown in FIG. 2, the white organic light-emitting stack WEL, disposed between the first and second electrodes 120 and 200, includes a charge generation layer 160, a first stack S1 located under the charge generation layer 160, and a second stack S2 located on the charge generation layer 160.

The first stack S1 may include a first common layer 130, a blue emissive layer 140, and a second common layer 150, and the second stack S2 may include a third common layer 170, a red emissive layer 175, a green emissive layer 180, and a fourth common layer 185.

Here, the first electrode 120 is a transparent electrode, and the second electrode 200 is a transflective electrode. The first electrode 120 is a transparent electrode made of indium tin oxide (ITO) or indium zinc oxide (IZO), and transmits light in the advancing direction thereof without optical loss, and the second electrode is made of a thin transflective metal, such as Ag or an AgMg alloy, and simultaneously transmits light in the advancing direction thereof and reflects the light from the surface thereof. In comparison between the second electrode 200 and the reflective plate 117, the second electrode 200 has a small thickness of 200 Å or less, since the second electrode must reflect light from the surface thereof through microscale resonance and must partially transmit the light, whereas the reflective plate 117 is formed so as to be thicker than the second electrode 200, since the reflective plate must perform only reflection and must not transmit light downwards. The reflective plate 117 is made of a reflective metal including any one of Ag, an Ag alloy, Al, an Al alloy, and APC (Ag:Pb:C), and functions as a mirror. The second electrode 200 is a transparent oxide electrode made of AgMg, an alloy including the same, indium tin oxide (ITO), or indium zinc oxide (IZO), functions as a half mirror, amplifies and transmits only a specific wavelength of light of each of red, green, and blue set as the resonance distance below the second electrode 200 through constructive interference, and repeatedly reflects the remainder of the light in the space between the second electrode 200 and the reflective plate 117.

The first electrode 120, which is a transparent oxide electrode made of indium tin oxide (ITO) or indium zinc oxide (IZO) or a nitride electrode including titanium (Ti), zinc, and indium, has high interface consistency with the first common layer 130 formed first in the white organic light-emitting stack WEL, is transparent, has a work function identical or similar to ITO, and directly improves morphology at the interface with the organic layer through general surface treatment.

In an organic light-emitting device array according to the present disclosure, as shown in FIG. 2, the white organic light-emitting stack WEL has a plurality of organic layers 130 to 185, and particularly the first stack S1 (130 to 150) and the second stack S2 (170 to 185), which are different light-emitting stacks, are formed in the state of being divided by the charge generation layer 160.

The greatest feature of the white organic light-emitting stack WEL in the organic light-emitting device array according to the present disclosure is that the organic layers constituting the white organic light-emitting stack WEL are formed so as to cover all of the subpixels without discrimination between the subpixels RSP, GSP, BSP, and WSP. That is, the organic layers may be formed by depositing the active area including at least all of the subpixels using a common mask having an opening.

The organic light-emitting device array according to the present disclosure may be applied to a wearable device, such as a head mounted display device. The entire substrate 100 corresponds in size to any one of both eyes of a viewer. The distance of one of the substrate 100 and both eyes of the viewer is fixed by a reception device in which the organic light-emitting device array is mounted. When considering the movement of eyeballs in both eyes and sensing of images in the eyeballs, the organic light-emitting device array may be applied to a small size of less than about 3 inches. In this case, high-resolution subpixel disposition of 1000 pixels (one pixel including three or more subpixels) or more in the miniaturized area must be possible in order to realize an image corresponding to virtual reality or augmented reality in the head mounted display device. In this case, the width of each subpixel may be less than 10 µm.

Meanwhile, in the high-resolution, high-integration organic light-emitting device array (display panel), a different deposition mask is required by color of each transport layer and each emissive layer in order to differently express a color of a hole/electron transport layer (a common layer) or an emissive layer (a blue emissive layer, a red emissive layer, or a green emissive layer) for every subpixel. In an organic material deposition process using a deposition mask, a vaporized organic material is deposited in the state in which the deposition mask is spaced apart from the substrate. However, it is difficult to realize a deposition mask having an opening of microscale width, and the opening and the deposited portion do not completely correspond to each other due to an interference phenomenon at the edge of the opening but a larger area than the opening is deposited or the thickness of deposition at the edge of the opening varies even in the case in which an opening of microscale width is used. When the deposition mask and the substrate are misaligned with each other due to this, the organic material is deposited at an incorrect position or while having a thickness difference in the same light-emitting portion, which causes a great reduction in yield.

In the head mounted display device according to the present invention requiring miniaturization and high integration, the emissive layers of the white organic light-emitting stack WEL are not divided for each of the subpixels, the plurality of stacks including the emissive layers may be identically stacked with respect to all of the subpixels, and the color compensation layer 190 provided between the white organic light-emitting stack WEL and the reflective plate 117 below the first electrode 120 is provided so as to have the same thickness with respect to all of the subpixels, whereby the construction of the white organic light-emitting stack WEL and the color compensation layer 190 is unified and thus it is possible to reduce process deviation for each subpixel. In addition, there is no thickness difference of the color compensation layer 190 for each subpixel, whereby a contact hole (CT1) forming process of connecting the first electrode 120 and the thin film transistor 115 thereunder may be simplified into a single process. That is, a thin film transistor 115 is formed on a first dielectric film 110, a second dielectric film 116 configured to protect the same is formed, a reflective plate 117 having a reflection function is formed so as to have an area equal to or greater than the area of the light-emitting portion of each of the subpixels RSP, GSP, BSP, and WSP, and a color compensation layer 190 having the same thickness with respect to all of the subpixels RSP, GSP, BSP, and WSP is formed. Subsequently, a first contact hole CT1 is formed through the color compensation layer 190 and the second dielectric film 116 for each of the subpixels RSP, GSP, BSP, and WSP such that a predetermined portion of the thin film transistor 115 is exposed. Since the color compensation layer 190 and the second dielectric film 116 have the same thickness in the subpixels RSP, GSP, BSP, and WSP, the process of forming the first contact hole CT1 may be uniformly performed as a single process in all of the subpixels. In the structure in which the thickness between the first electrode and the reflective plate is changed for each of subpixels having different colors in order to change color expression for each subpixel, the dielectric forming process and the contact hole forming process may be differently performed for each subpixel in order to achieve a thickness difference, whereby process burden is great.

Here, when light is generated in the white organic light-emitting stack WEL between the first and second electrodes 120 and 220, the light randomly advances in the upward-downward direction in the emissive layers 140, 175, and 180 without directivity. At this time, the light generated in the white organic light-emitting stack WEL advances upwards to generate first light RL1, GL1, and BL1 directly transmitted to the second electrode 200 with respect to red, green, and blue wavelengths and second light RL2, GL2, and BL2 advancing toward the first electrode 120. The second light RL2, GL2, and BL2 is reflected by the surface of the reflective plate 117 and is thus converted into reflected light RRL, GRL, and BRL. The reflected light RRL, GRL, and BRL advances via the color compensation layer 190, the first electrode 120, the white organic light-emitting stack WEL, and the second electrode 200. The first light RL1, GL1, and BL1 and the reflected light RRL, GRL, and BRL have a constructive interference relationship in red, green and blue wavelengths.

That is, in the display panel according to the present disclosure, the light generated in the white organic light-emitting stack WEL is repeatedly reflected and re-reflected between the reflective plate 117 and the second electrode 200, and is transmitted while commonly simultaneously having a microscale resonance effect in red, green and blue wavelengths.

The first common layer 130 may include a hole injection layer HIL and a hole transport layer HTL, and the second common layer 150 may include an electron transport layer ETL.

The third common layer 170 may include a hole transport layer HTL, and the fourth common layer 185 may include an electron transport layer ETL and an electron injection layer EIL.

The first and third common layers 130 and 170 located below the emissive layers 1400 and 175/180 in the first stack S1 and the second stack S2 commonly have a hole transport layer; however, this layer may or may not include the same material in the first and second stacks S1 and S2. In addition, the second and fourth common layers 150 and 185 commonly have an electron transport layer; however, this layer may or may not include the same material in the first and second stacks S1 and S2, in the same manner. The first and third common layers 130 and 170 provided in the first stack S1 and the second stack S2 participate in hole injection and hole transport, and the second and fourth common layers 150 and 185 participate in electron transport and electron injection. When the difference in movement speed of a carrier is necessary in the first and second stacks S1 and S2, a host component and a dopant included in each layer may be changed, or the amount of the dopant may be adjusted.

Meanwhile, the charge generation layer 160 may be formed by dividing and stacking an n-type charge generation layer and a p-type charge generation layer so as to be stratified, or may be formed as a single layer by including an n-type dopant and a p-type dopant in one or more hosts. When the charge generation layer 160 is formed by dividing an n-type charge generation layer and a p-type charge generation layer, the second common layer 150 and the third common layer 130 may be omitted, and the n-type charge generation layer and the p-type charge generation layer may also perform the functions of an electron transport layer and a hole transport layer, respectively, depending on circumstances.

In the white organic light-emitting stack WEL, each of the first to fourth common layers 130, 150, 170, and 185 performs the function of adjusting the optical distance of a corresponding one of the emissive layers 140, 175, and 180 in addition to hole or electron carrier transport.

The color of light emitted from the white organic light-emitting stack WEL depends on the properties of a dopant provided in each of the emissive layers 140, 175, and 180. A red dopant having a peak wavelength within 600 nm to 650 nm may be used for the red emissive layer 175, and the green emissive layer 180 may include a green, yellow-green, or yellow dopant having a peak wavelength within 500 nm to 590 nm. Each of the emissive layers 140, 175, and 180 includes a dopant having a corresponding color wavelength in one or more hosts, and each host transmits energy to the dopant in order to excite the dopant.

For example, one or more hosts and a blue fluorescent dopant or a blue phosphorescent dopant may be used for the blue emissive layer 140. In the case in which a boron-based dopant is used as the blue fluorescent dopant, the peak wavelength thereof is within a range of 435 nm to 475 nm, whereby blue light similar to deep blue is emitted. The light emission property of the blue dopant is that intensity is equivalent to 50% or more of the intensity of a peak wavelength within a small full width at half maximum (FWHM) of 20 nm to 35 nm, and blue light emitted from the blue emissive layer 140 within a small wavelength range of deep blue is emitted through the second electrode 200 while being included in a white spectrum.

In the same manner, in the display panel according to the present v, microscale resonance generated between the color compensation layer 190, the first electrode 120, and the white organic light-emitting stack WEL exhibits the light emission property within a small full width at half maximum of 55 nm or less by a reflection optical path extended by the color compensation layer 190 for green and red wavelengths, whereby red, green, and blue light emission peaks may be distinctly distinguished and thus a light emission spectrum distinguished in red, green, and blue may be obtained.

The red emissive layer 175 may be formed of one or more hosts and a red dopant. At this time, the material of the hosts used in the red emissive layer 175 may have an aryl group as a core, and may be selected from the group consisting of a substituted or unsubstituted aryl group having a carbon number of 6 to 24, a substituted or unsubstituted heteroaryl group, a substituted or unsubstituted condensed aryl group having a carbon number of 10 to 30, a substituted or unsubstituted heteroaryl group having a carbon number of 2 to 24, a substituted or unsubstituted alkyl group having a carbon number of 1 to 24, a substituted or unsubstituted heteroalkyl group having a carbon number of 1 to 24, a substituted or unsubstituted cycloalkyl group having a carbon number of 3 to 24, a substituted or unsubstituted alkoxy group having a carbon number of 1 to 24, a substituted or unsubstituted aryloxy group having a carbon number of 6 to 24, a substituted or unsubstituted alkylsilyl group having a carbon number of 1 to 24, a substituted or unsubstituted arylsilyl group having a carbon number of 6 to 24, a cyano group, a halogen group, deuterium, and hydrogen. R to R14 may form a condensed ring with a neighboring substituent. At this time, the component of the host included in the red emissive layer 175 may have an aryl group as a core, and may be selected from the group consisting of phenyl, naphthalene, fluorene, carbazole, phenazine, phenanthroline, phenanthridine, acridine, cinnoline, quinazoline, quinoxaline, naphthyridine, phthalazine, quinolizine, indole, indazole, pyridazine, pyrazine, pyrimidine, pyridine, pyrazole, imidazole, and pyrrole. As an example, the material of the host of the red emissive layer 175 may be CBP, CDBP, mCP, BCP, BAlq, or TAZ, and one or more materials may be included.

In addition, the red emissive layer 175 includes a dopant configured to emit red, and a phosphorescent dopant may be Ir(piz)3(Tris(1-phenylisoquinoline)iridium(III), Ir(piq)2 (acac)(Bis(1-phenylisoquinoline)(acetylacetonate)iridium (III), Ir(bip)2(acac)(Bis(2-benzolbithiophen-2-yl-pyridime) (acetylacetonate)iridium(III)), or Ir(BT)2(acac)(Bis(2-pheylbenzothazolato) (acetylacetonate)iridium(III)). However, the present invention is not limited thereto. In addition, an example of a fluorescent dopant that may be included in the red emissive layer 175 may be Rubrene (5,6,11,12-tetraphenylnaphthacene), DCJTB (4-(dicyanomethylene)-2-tert-butyl-6-(1,1,7,7,-tetramethyljuloidin-4-yl-viyl)-4H).

In addition, the green emissive layer 180 may include one or more mixed hosts, and at least one dopant. Specifically, a phosphorescent host material made of a carbazole-based compound or a metal complex may be doped with a phosphorescent yellow-green dopant. The carbazole-based compound may include CBP (4,4'-bis(carbazole-9-yl)-biphenyl), a CBP derivative, mCP (N, N'-dicarbazolyl-3, 5-benzene), or an mCP derivative, and the metal complex may include a ZnPBO(phenyloxazole) metal complex or a ZnPBT(phenylthiazole) metal complex. A light emission peak corresponding to the first emissive layer 223 may be within a range of 510 nm to 590 nm, and may have the peak property of a green wavelength or a yellow-green wavelength depending on circumstances.

At the first subpixel, light is amplified while being resonated in microscale within the distance between the reflective plate 117 and the second electrode 200, and is emitted to the second electrode 200.

The layers constituting the white organic light-emitting stack WEL are commonly provided at the subpixels RSP, GSP, BSP, and WSP. A fine metal mask used to selectively divide and leave an organic material by subpixel is not necessary, and the same common mask may be used to form the layers. In all of the subpixels RSP, GSP, BSP, and WSP, therefore, the organic layers constituting the white organic light-emitting stack WEL have the same stratified formation.

In the display panel according to the present disclosure, the color compensation layer 190 between the reflective plate 117 and the first electrode 120 is configured to have the same material and the same thickness H so as to have the same optical distance, and substantially has the same optical effect for the subpixels RSP, GSP, BSP, and WSP in the vertical distance from the reflective plate 117 to the second electrode 200.

In the display panel according to the first embodiment of the present invention, the red subpixel, the green subpixel, and the blue subpixel further have a red color filter layer 410, a green color filter layer 420, and a blue color filter layer 430 above the second electrode 200 in order to transmit only a corresponding color wavelength of the white spectrum.

In the display panel according to the present disclosure, the substrate 100 may be one of a transparent glass substrate, a transparent plastic substrate, and a silicon substrate. The material of the substrate 100 may be varied depending on the form of a display device to which the display panel is applied. For example, in a head mounted display deice configured to be close to the eyes of a viewer, the size of the display panel is reduced to a few inches, and the silicon substrate, which is configured to be easily patterned in ultrahigh integration, may be used such that ultrahigh-resolution expression is possible in a miniaturized area. However, the transparent glass substrate or the transparent plastic substrate may be alternatively used as long as the substrate is capable of being patterned in ultrahigh resolution.

Reference numeral 115, which has not been described with reference to FIG. 1, indicates a thin film transistor, which is connected to the first electrode 120 via the contact hole CT1 to apply a driving signal to the first electrode 120.

The first dielectric film 110 is provided between the substrate 100 and the thin film transistor 115, and has a buffer function of preventing the thin film transistor 115 and the components located thereabove from being affected by impurities in the substrate 100. Depending on circumstances, the first dielectric film 110 having the buffer function may be omitted.

In addition, the thin film transistor 115 may be electrically insulated from the reflective plate 117 via the second dielectric film 116, or the reflective plate 117 may extend in the horizontal direction so as to be electrically connected to the contact hole CT1.

Meanwhile, the light-emitting portion of each of the subpixels RSP, GSP, BSP, and WSP is defined by a bank 125 configured to cover the edge of the first electrode 120 and to have an opening. The reflective plate 117 is formed so as to have a larger area than at least the light-emitting portion, thereby preventing optical loss and maximizing reflection efficiency of light transmitted downwards from the white organic light-emitting stack WEL.

Particularly, in the display panel according to the present disclosure, as shown in FIG. 4, final light emitted to above the second electrode 200 is emitted as a three-peak white spectrum, whereby highly efficient white display is possible, although the white subpixel SWP has no color filter layer on the second electrode 200. In addition, the red color filter layer 410, the green color filter layer 420, and the blue color filter layer 430 configured to selectively transmit a specific wavelength of the light emitted while having the three-peak white spectrum are further provided on the second electrode 200, as in the filter unit FA, whereby light that has passed through the red color filter layer 410, the green color filter layer 420, and the blue color filter layer 430 from the red, green, and blue subpixels RSP, GSP, and BSP has a light emission effect at different red, green, and blue wavelengths, as shown in FIG. 5.

Meanwhile, FIG. 6, in which 0 of the vertical axis corresponds to the lower surface of the second electrode 200 shown in FIG. 1 and 200 nm of the vertical axis corresponds to the upper surface of the first electrode 120, shows the optimum positions of the emissive layers between the first electrode 120 and the second electrode 200.

As shown in FIG. 6, the blue emissive layer (EML) 140 having a light emission peak property within a range of about 440 nm to 470 nm may be formed so as to have a thickness of 15 nm to 35 nm at a position spaced apart from the upper surface of the first electrode 120 by a vertical distance within a range of 25 nm to 65 nm. In addition, the red emissive layer (EML) 175 having a light emission peak property within a range of 610 nm to 640 nm may be formed so as to have a thickness of 10 nm to 25 nm at a position spaced apart from the lower surface of the second electrode 200 by a vertical distance within a range of 15 nm to 50 nm, and the green emissive layer (EML) 180 having a light emission peak property within a range of 525 nm to 560 nm in the state of being adjacent to the red emissive layer (EML) 175 may be formed so as to have a thickness of 20 nm to 40 nm at a position spaced apart from the lower surface of the second electrode 200 by a vertical distance within a range of 30 nm to 90 nm.

In the example shown in FIG. 6, in the display panel according to the first embodiment of the present invention shown in FIG. 1, an experiment was performed in the state in which the distance between the upper surface of the first electrode 120 and the lower surface of the second electrode 200, i.e. the thickness of the white organic light-emitting stack WEL, is set to 200 nm, as a first experimental example. In the display panel according to the present disclosure, the white organic light-emitting stack WEL is not limited thereto, and may be varied in a tandem structure in which a stack S1 having a blue emissive layer and a stack S2 having a red/green emissive layer are divided from each other. As needed, a stack having a blue emissive layer may be further included. In this case, the total thickness of the white organic light-emitting stack WEL may increase, and the thickness of the emissive layers and common layers provided therein may be reduced in order to reduce the total thickness of the white organic light-emitting stack WEL. Generally, the total thickness of the white organic light-emitting stack WEL may be set to 1500 Å to 6000 Å (150 nm to 600 nm) in order to adjust the optical distance of the white organic light-emitting stack WEL. In addition, the thickness of the color compensation layer 190 located between the first electrode 120 and the reflective plate 117 is formed so as to be greater than the thickness of the white organic light-emitting stack WEL, whereby white spectrum light having all of the light emission peak properties of red, green, and blue is emitted through the second electrode 200 through adjustment of reflected light, as shown in FIG. 4.

The color compensation layer 190 is located at the lower side of the first electrode 120, is made of an inorganic dielectric film, and may be formed in a thin film transistor array process. For example, the first dielectric film 110 and the second dielectric film 116 of FIG. 1 may include at least one of a silicon oxide film (SiOx), a silicon nitride film (SiNx), or a silicon oxynitride film (SiOxNy). The color compensation layer 190 may include the same material as one of the first and second dielectric films 110 and 116, and may include at least one of a silicon oxide film (SiOx), a silicon nitride film (SiNx), or a silicon oxynitride film (SiOxNy).

FIG. 6 shows an example in which the color compensation layer 190 is made of a silicon oxide film and has a thickness of 770 nm. In the display panel to which the color compensation layer 190 is applied, it is possible to commonly acquire a light emission spectrum of red, green, and blue from light passing through the second electrode 200 irrespective of the red, green, blue, and white subpixels.

As shown in FIG. 1, the color compensation layer 190 is located between the reflective plate 117 and the first electrode 120, has an electrical insulation function, is transparent, and must hardly absorb light. Patterning of the color compensation layer 190 is required when the contact hole CT1 is provided between the thin film transistor 115 and the first electrode 120. In one embodiment, the color compensation layer 190 may be made of an inorganic dielectric film having an etching property that is the same or similar to that of the inorganic dielectric film included in the thin film transistor array.

The color compensation layer 190 may have a refractive index similar to those of the organic layers included in the white organic light-emitting stack WEL, e.g. a refractive index of about 1.5 to 2.3. In the case in which the color compensation layer 190 includes, for example, a nitrogen component, such as a silicon nitride film, the color compensation layer 190 may have a refractive index greater than that of a silicon oxide film. When the same optical distance is realized, therefore, the silicon nitride film, as the color compensation layer 190, may be formed so as to be thinner than the silicon oxide film.

Hereinafter, an example in which the distance between a reflective plate 11 and a first electrode 13 is differently applied so as to have the optimum optical distance for the red, green, and blue subpixels compared to the first embodiment (the first experimental example) of the present disclosure described above will be described. This is shown as a second experimental example.

Figure 7:
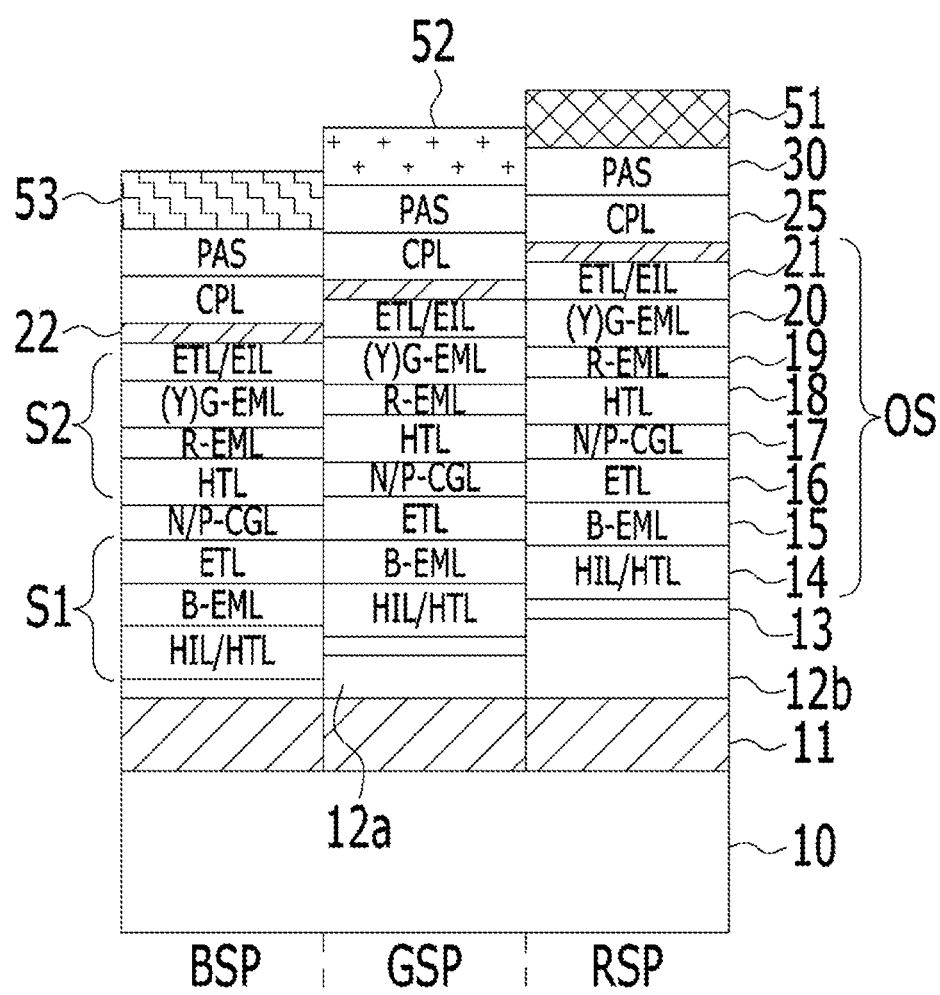
FIG. 7 is a sectional view showing a display panel according to a second experimental example.
Figure 8A:
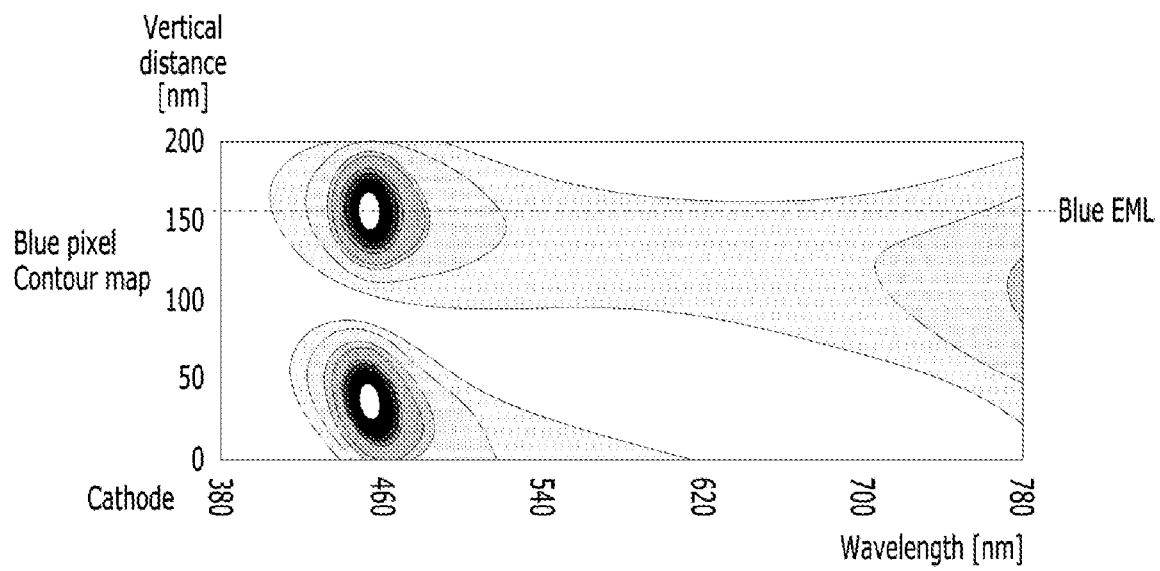
FIGS. 8A to 8C are contour maps of emissive layers in blue, green, and red subpixels of the display panel according to the second experimental example.
Figure 8B:
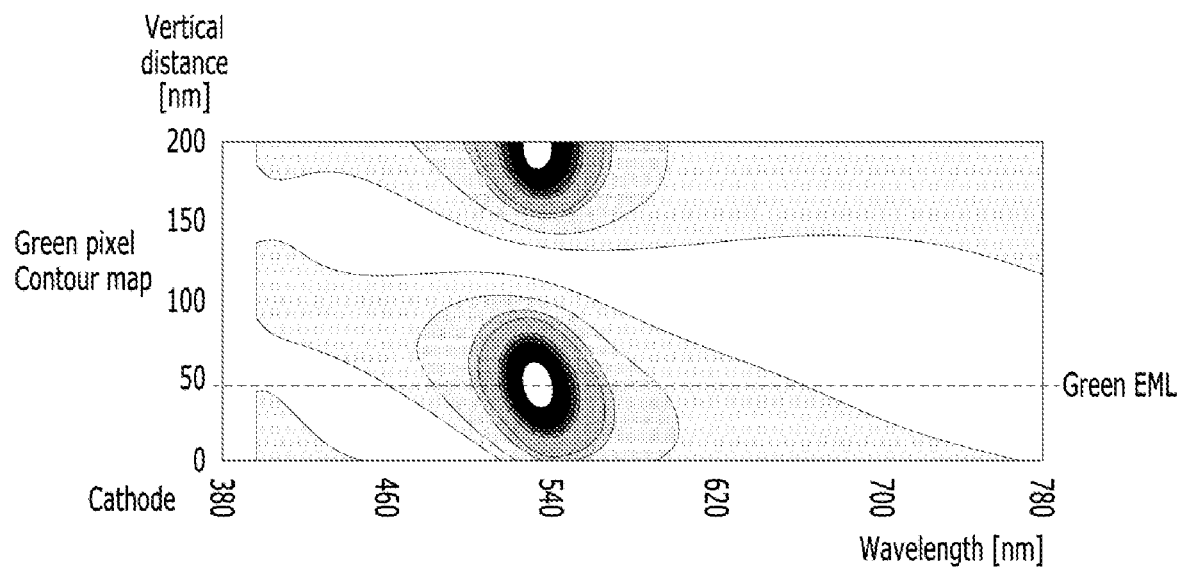
Figure 8C:
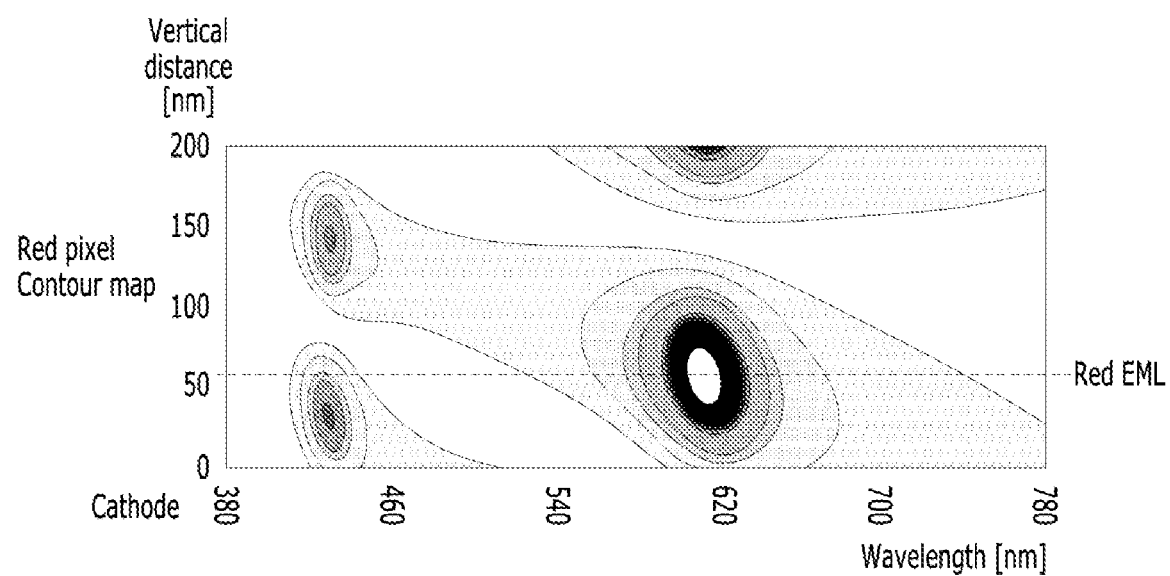
Figure 9A:
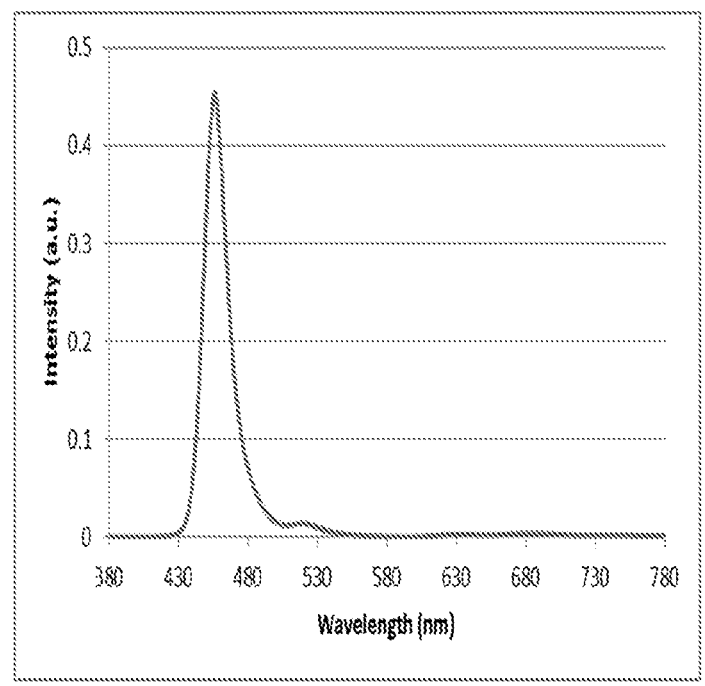
FIGS. 9A to 9C are graphs showing spectrums of the blue, green, and red subpixels of the display panel according to the second experimental example.
Figure 9B:
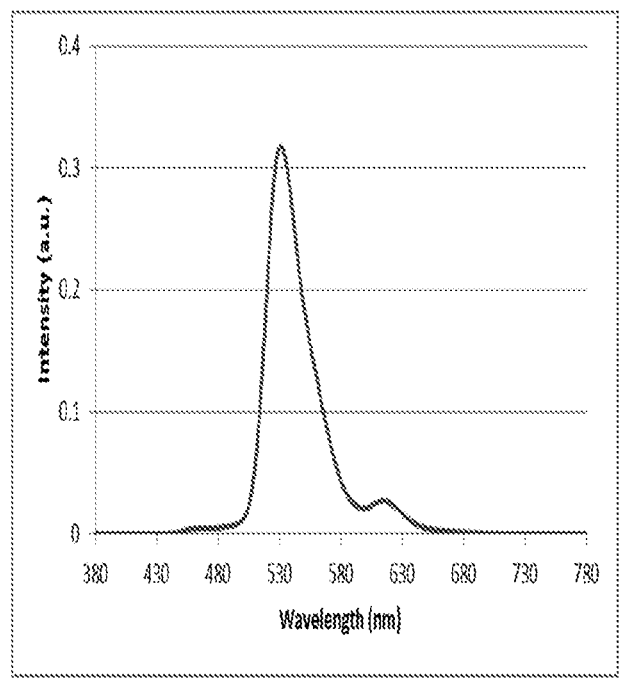
Figure 9C:
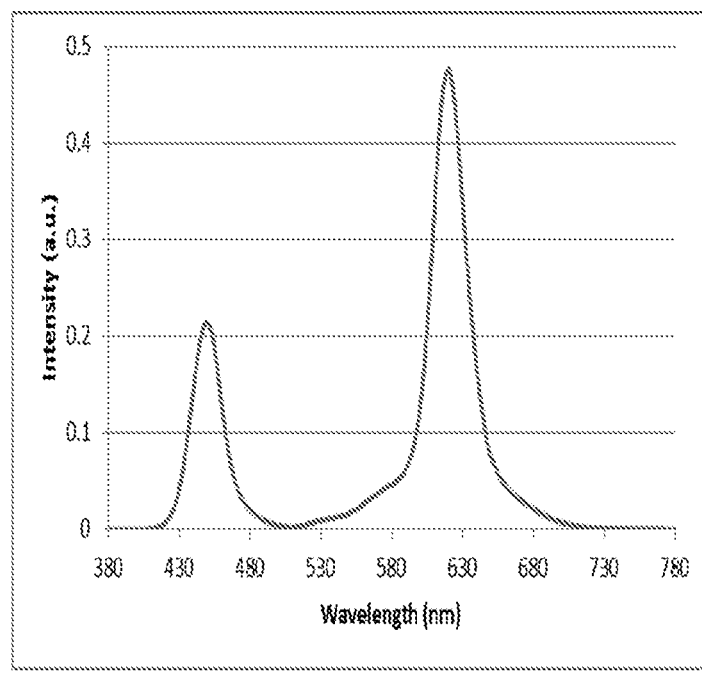

FIG. 7 is a sectional view showing a display panel according to a second experimental example, and FIGS. 8A to 8C are contour maps of emissive layers in blue, green, and red subpixels of the display panel according to the second experimental example. In addition, FIGS. 9A to 9C are graphs showing spectrums of the blue, green, and red subpixels of the display panel according to the second experimental example.

As shown in FIG. 7, the display panel according to the second experimental example includes a red subpixel RSP, a green subpixel GSP, and a blue subpixel BSP disposed on a substrate 10, commonly has a reflective plate 11 on the substrate 10 for the subpixels RSP, GSP, and BSP, has an organic stack OS and a second electrode 22 having the same stack structure as the first electrode 13 on the reflective plate 11, and has first and second compensation layers 12a and 12b having different thicknesses at the green subpixel GSP and the red subpixel RSP between the organic stack OS and the reflective plate 11.

Here, the organic stack OS is provided at each of the subpixels RSP, GSP, and BSP between the first electrode 13 and the second electrode 22, and includes a charge generation layer 17, a first stack S1 located under the charge generation layer 17, and a second stack S2 located on the charge generation layer 17. The first stack S1 may include a first common layer 14 for hole injection and hole transport, a blue emissive layer (B-EML) 15, and a second common layer 16 for electron transport, and the second stack S2 may include a third common layer 18 for hole transport, a red emissive layer 19, a green emissive layer or a yellow-green emissive layer 20, and a fourth common layer 21 for electron transport and electron injection.

In addition, a second electrode 22, a CPL layer (having an organic capping layer and an inorganic capping layer) 25, and an encapsulation layer 30 may be provided on the organic stack OS.

A red color filter layer 51, a green color filter layer 52, and a blue color filter layer 53 are provided on the encapsulation layer 30 for the red subpixel RSP, the green subpixel GSP, and the blue subpixel BSP.

In the second experimental example, the first and second compensation layers 12a and 12b of the green subpixel GSP and the red subpixel RSP have different thicknesses such that the distance between the reflective plate 11 and the first electrode 13 varies by subpixel, whereby the optimum color wavelength is selectively emitted from each subpixel, compared to the display panel according to the first embodiment described above.

In this case, when the second experimental example is applied, as shown in FIGS. 8A and 9A, there is no distance between the reflective plate 11 and the first electrode 13 of the blue subpixel BSP such that blue light is adjusted so as to have the optimum microscale resonance effect from the organic stack OS between the first electrode 13 and the second electrode 22, whereby only the blue light is generated. Also, in the green subpixel BSP, as shown in FIGS. 8B and 9B, green light is adjusted so as to have the optimum microscale resonance effect between the reflective plate 11 and the second electrode 22, whereby only the green light is generated.

Furthermore, in the red subpixel RSP, as shown in FIGS. 8C and 9C, red light is adjusted so as to have the optimum microscale resonance effect between the reflective plate 11 and the second electrode 22, whereby only the red light is generated. Although some blue light similar to ultraviolet light is generated, this has a lower wavelength than visible light and thus is difficult to see, or rather may appear as leakage of light from the red subpixel.

Consequently, in order to reduce leakage of light from each color subpixel and to selectively transmit a wavelength of each color subpixel, as shown in FIG. 7, the red, green, and blue color filters 51, 52, and 53 are applied to the red, green, and blue subpixels in the second experimental example.

As described above, in the display panel according to the second experimental example, the distance between the reflective plate 11 and the first electrode 13 is set to different conditions in the structure below the second electrode 22 before passing through the color filters such that the red, green, and blue subpixels selectively emit red, green, and blue light, and settings are performed. In this structure, the organic stack OS between the first electrode 13 and the second electrode 22 is adjusted to transmit blue light. Even in the case in which all of the red, green, and blue subpixels RSP, GSP, and BSP are turned on, therefore, the blue peak property is prominent, and it is difficult to uniformly secure the peak properties of the other color wavelengths to the extent corresponding to blue, whereby it is difficult to express white having balance.

Hereinafter, other embodiments having the same effect as the display panel according to the first embodiment of the present invention will be described.

FIG. 10 is a sectional view showing a display panel according to a second embodiment of the present invention.

As shown in FIG. 10, the display panel according to the second embodiment of the present disclosure may be identical to the structure of FIG. 1 except that a transparent organic layer is not provided in a transmission unit TA of a white subpixel WSP.

In this case, the area corresponding to the transmission unit TA is completely empty, or when a passivation film is further provided at a filter unit FA and the transmission unit Ta in order to protect the surface of the display panel, the area may be filled with the passivation film.

Figure 11:
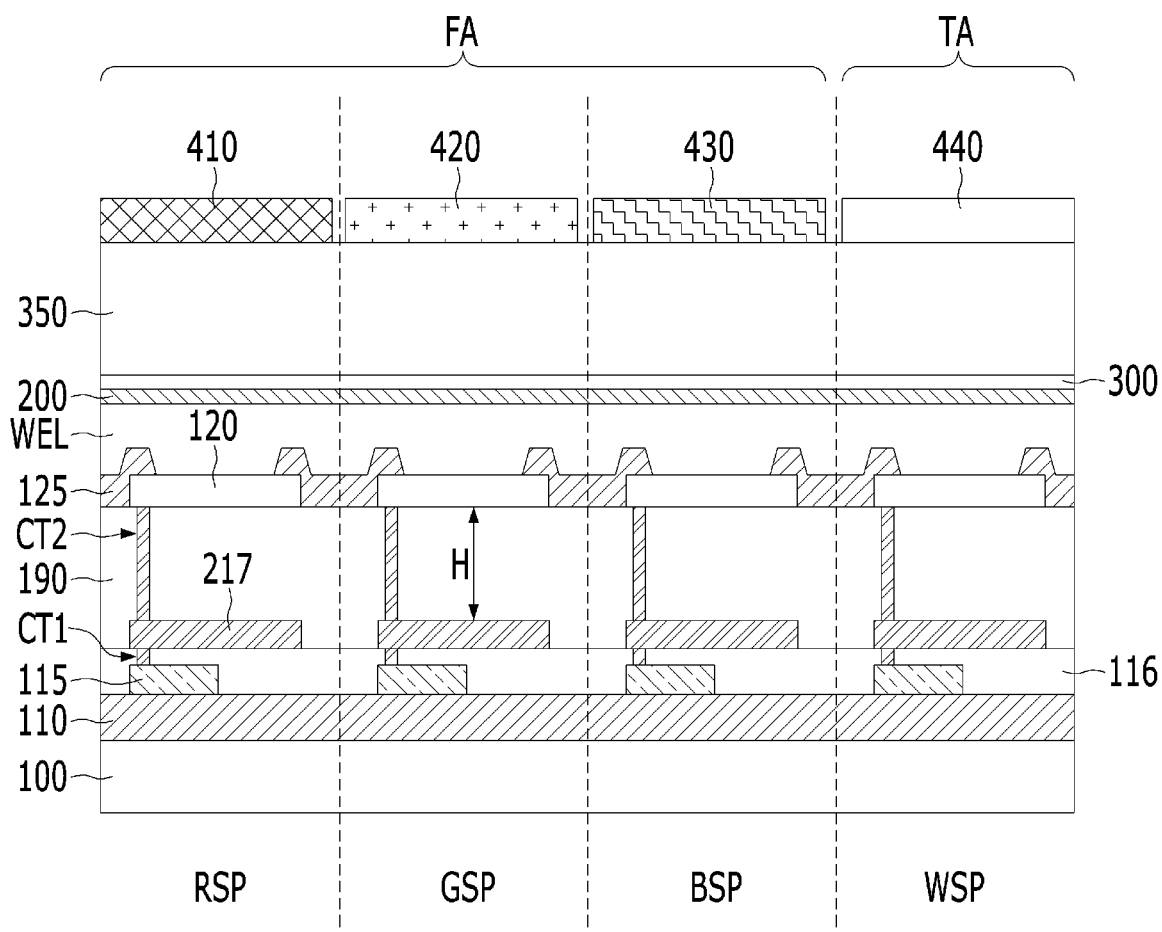
FIG. 11 is a sectional view showing a display panel according to a third embodiment of the present disclosure.

FIG. 11 is a sectional view showing a display panel according to a third embodiment of the present disclosure.

As shown in FIG. 11, in the display panel according to the third embodiment of the present invention, a reflective plate 217 extends in the horizontal direction to electrically connect a thin film transistor 115 thereunder and a first electrode 120 thereabove to each other, wherein a first contact hole CT1 is provided in a first dielectric film 116 such that the reflective plate 217 is primarily connected to the thin film transistor 115 via the first contact hole CT1 and the reflective plate 217 is secondarily connected to the first electrode 120 via a second contact hole CT2 formed through a color compensation layer 190 on the reflective plate 217, compared to the display panel according to the first embodiment of the present invention described above. That is, the reflective plate 217 and the thin film transistor 115 are connected to each other below the reflective plate 217, and the reflective plate 217 and the first electrode 120 are connected to each other above the reflective plate 217. The positions of the first contact hole CT1 and the second contact hole CT2 in the plane may be different from each other.

Depending on circumstances, a contact hole formed through the color compensation layer 190, the reflective plate 217, and the first dielectric film 116 may be provided below the first electrode 120 so as to be connected to the thin film transistor 115. Alternatively, the first electrode 120 and the thin film transistor 115 may be connected to each other, and the reflective plate 217 may be connected to any one of the first electrode 120 and the thin film transistor 115.

The other components of the display panel according to the third embodiment of the present disclosure may have the same functions as corresponding components of the display panel according to the first embodiment denoted by the same reference numerals, and a description thereof will be omitted.

Figure 12:
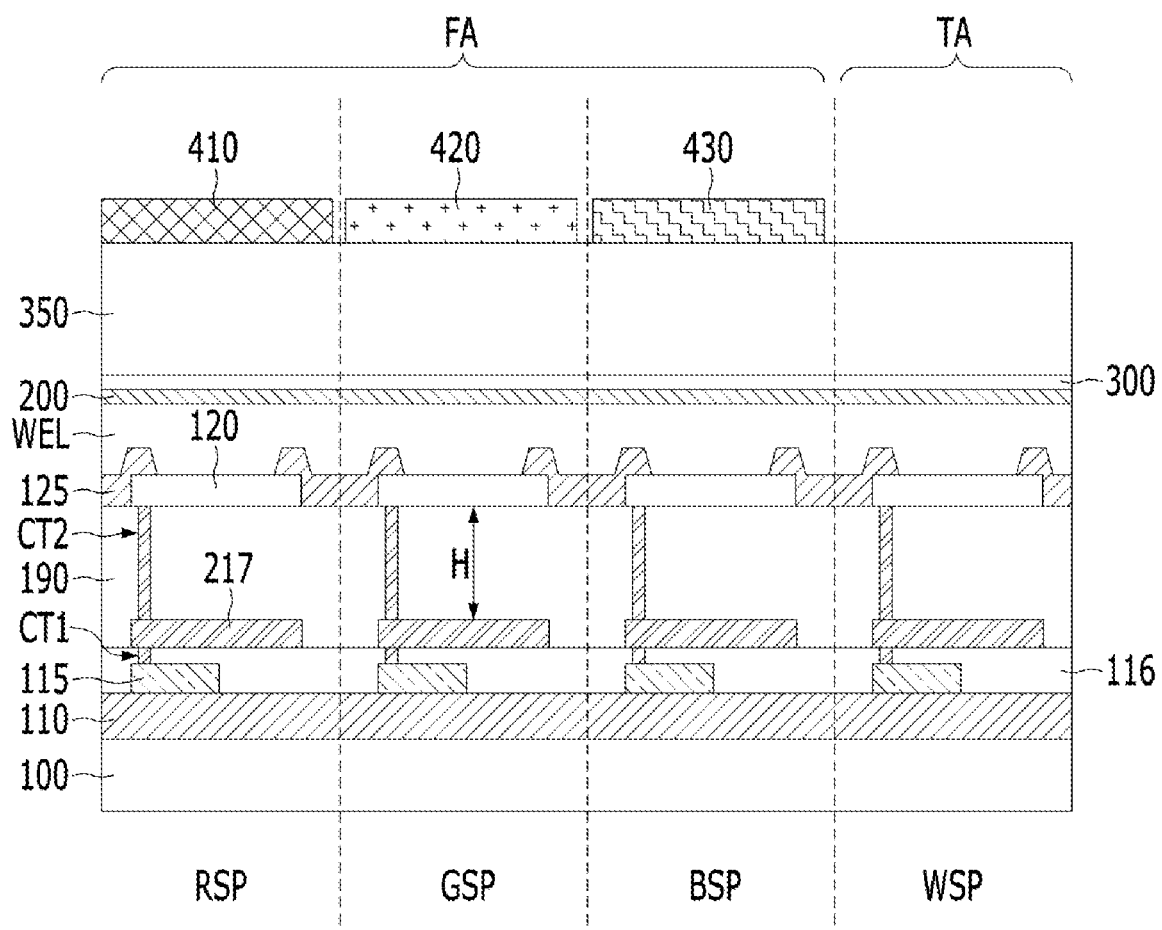
FIG. 12 is a sectional view showing a display panel according to a fourth embodiment of the present disclosure.

FIG. 12 is a sectional view showing a display panel according to a fourth embodiment of the present disclosure.

As shown in FIG. 12, the display panel according to the fourth embodiment of the present invention may be identical to the structure of the third embodiment except that no transparent organic layer is provided in a transmission unit TA of a white subpixel WSP.

In this case, the area corresponding to the transmission unit TA is completely empty, or when a passivation film is further provided at a filter unit FA and the transmission unit Ta in order to protect the surface of the display panel, the area may be filled with the passivation film.

In FIG. 6, an experiment was performed according to the first experimental example in the state in which the color compensation layer is made of a silicon oxide film and has a thickness of 770 nm. Hereinafter, an example in which an experiment was performed in the state in which the color compensation layer is made of a silicon nitride film will be described as a third experimental example.

Figure 13A:
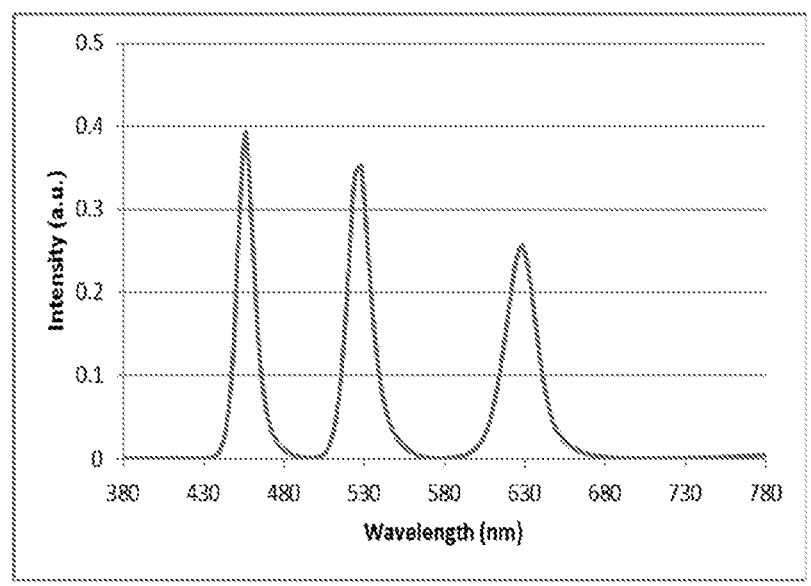
FIG. 13A is a graph showing a white spectrum of a third experimental example performed with respect to a modification of the first embodiment of the present disclosure.
Figure 13B:
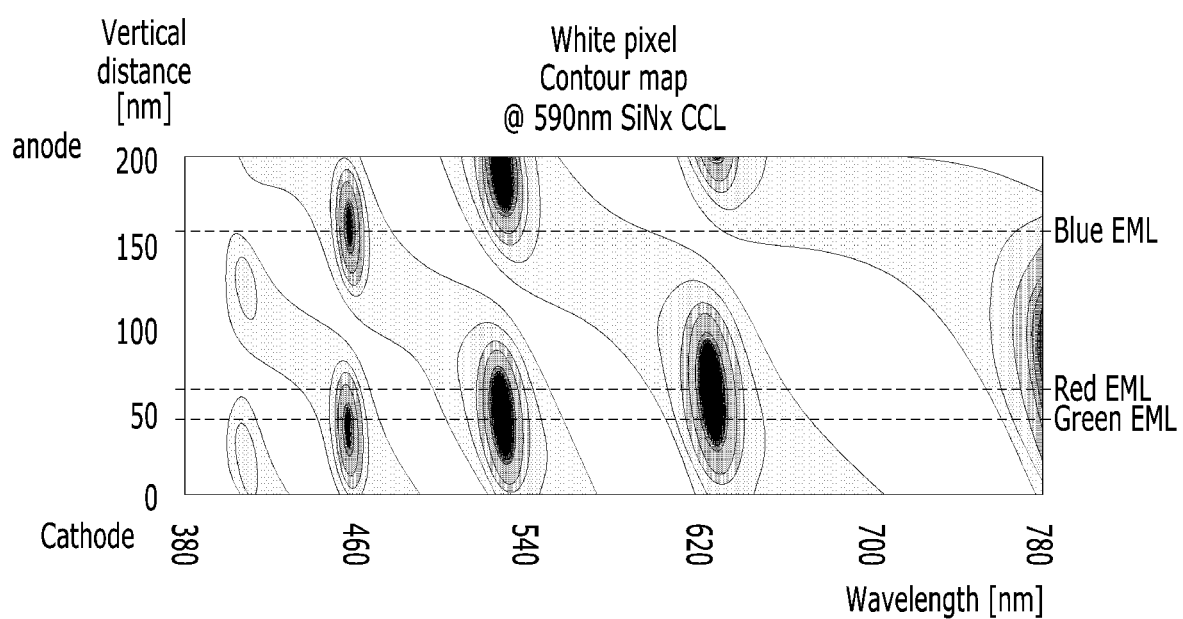
FIG. 13B is a contour map of blue, green, and red emissive layers of the third experimental example performed with respect to the modification of the first embodiment of FIG. 13A.

FIG. 13A is a graph showing a white spectrum of a third experimental example performed with respect to a modification of the first embodiment of the present invention, and FIG. 13B is a contour map of blue, green, and red emissive layers of the third experimental example performed with respect to the modification of the first embodiment of FIG. 13A.

As shown in FIG. 13A, in the display panel according to the third experimental example in which a color compensation layer is made of a silicon nitride film, has a thickness of 590 nm, and is applied to the structure of FIG. 1, blue, green, and red wavelengths are distinguished from each other, whereby the spectrum of light passing through a second electrode before passing through a color filter layer exhibits a clear light emission peak property. Even in the display panel according to the third experimental example, therefore, light having a white spectrum property having red, green, and blue light emission peaks may be emitted from a white subpixel having no color filter layer, whereby it is possible to realize a white subpixel.

Also, as shown in FIG. 13B, in the display panel according to the third experimental example, an experiment was performed in the state in which the distance between the upper surface of the first electrode 120 and the lower surface of the second electrode 200, i.e. the thickness of the white organic light-emitting stack WEL, is 200 nm. The blue emissive layer (EML) 140 having a light emission peak property within a range of about 440 nm to 470 nm may be formed so as to have a thickness of 15 nm to 35 nm at a position spaced apart from the upper surface of the first electrode 120 by a vertical distance within a range of 25 nm to 65 nm. In addition, the red emissive layer (EML) 175 having a light emission peak property within a range of 610 nm to 640 nm may be formed so as to have a thickness of 10 nm to 25 nm at a position spaced apart from the lower surface of the second electrode 200 by a vertical distance within a range of 15 nm to 50 nm, and the green emissive layer (EML) 180 having a light emission peak property within a range of 525 nm to 560 nm in the state of being adjacent to the red emissive layer (EML) 175 may be formed so as to have a thickness of 20 nm to 40 nm at a position spaced apart from the lower surface of the second electrode 200 by a vertical distance within a range of 30 nm to 90 nm. That is, even in the case in which the third experimental example is applied, the emissive layers of the white organic light-emitting stack are located at similar positions in the same condition as the first experimental example, whereby it is possible to obtain a uniform light emission spectrum of red, green, and blue wavelengths having similar levels from the red, green, blue, and white subpixels.

Hereinafter, the results of evaluation of the panel efficiencies of the second experimental example and the first and third experimental examples will be described.

TABLE 1

|  | Second experimental example | First experimental example | Third experimental example |
| --- | --- | --- | --- |
| Structure of compensation layer or color compensation layer | RSP (1330 Å)/GSP (650 Å) | SiOx (7700 Å) | SiNx (5900 Å) |
| Panel efficiency | 100% | 128% | 106% |

On the assumption that panel efficiency is 100% in the second experimental example in which the compensation layers are differently provided at only the red subpixel and the green subpixel in order to vary the optical distance between the reflective plate and the second electrode in the red, green, and blue subpixels RSP, GSP, and BSP, it can be seen that, when the color compensation layer is made of SiOx and has a thickness of 7700 Å commonly with respect to all of the subpixels, as in the first experimental example, panel efficiency is 128% of the panel efficiency of the second experimental example, whereby panel efficiency is remarkably improved. In addition, it can be seen that, when the color compensation layer is made of SiNx and has a thickness of 5900 Å commonly with respect to all of the subpixels, as in the third experimental example, panel efficiency is 106% of the panel efficiency of the second experimental example, whereby the panel efficiency is improved. That is, in the case in which the color compensation layer located between the reflective plate and the first electrode is thicker than the white organic light-emitting stack such that microscale resonance is sufficiently possible with respect to the red, green, and blue wavelengths in order to adjust the reflected light advancing area such that light is emitted through the second electrode, as in the first to fourth embodiments of the present invention, all of the subpixels may have white spectrums having three color peak properties, whereby it is possible to express white in the transmission unit having no color filter above the second electrode and at the same time to improve panel efficiency.

Hereinafter, the construction of a display panel further embodied including the thin film transistor will be described in detail.

Figure 14:
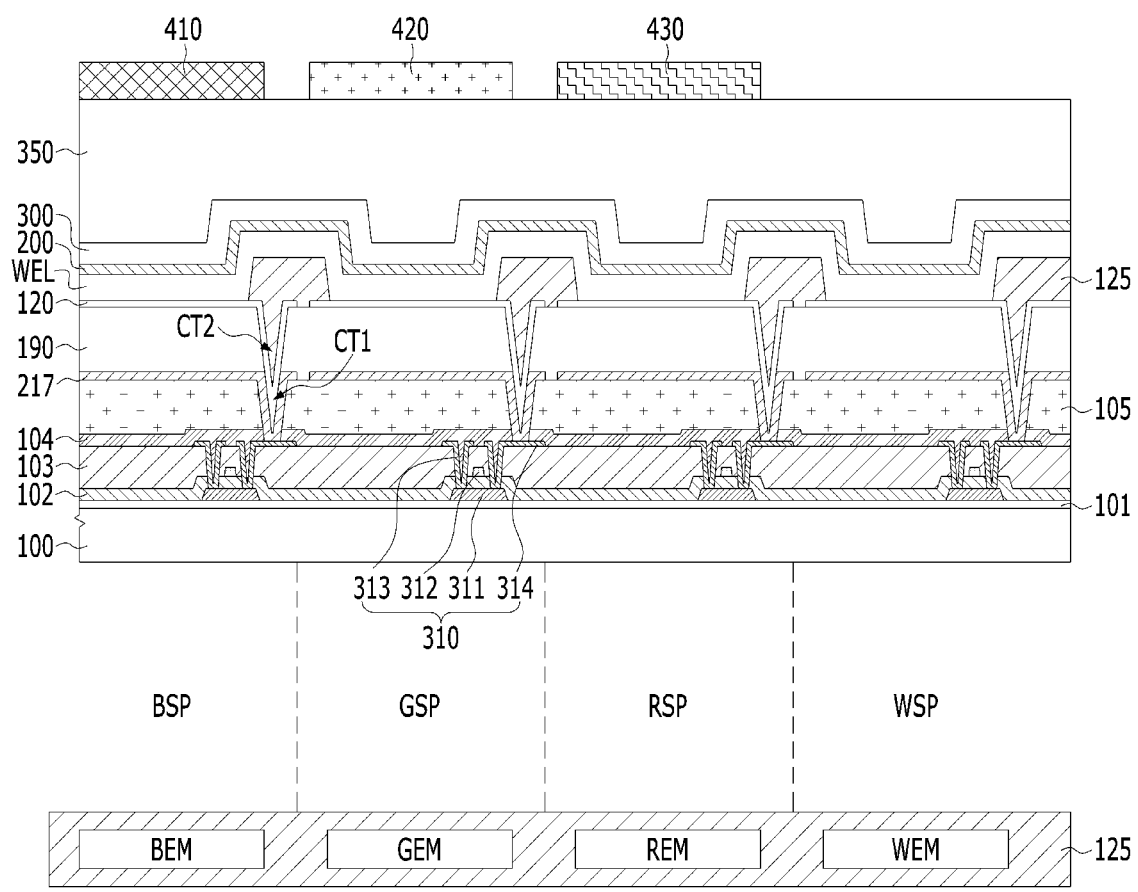
FIG. 14 is a detailed sectional view of the display panel according to the fourth embodiment of the present disclosure according to one embodiment.

FIG. 14 is a detailed sectional view of the display panel according to the fourth embodiment of the present invention.

As shown in FIG. 14, the display panel according to the fourth embodiment of the present disclosure may have a buffer layer 101 on a substrate 100 regularly having red, green, blue, and white subpixels RSP, GSP, BSP, and WSP, may have a driving thin film transistor 310 on the buffer layer 101 for each of subpixels B-S, G-S, and R-S, and may have the construction of the organic light-emitting device array described with reference to FIG. 1 so as to be connected to each driving thin film transistor 310.

Meanwhile, in the display panel according to the present disclosure, the substrate 100 may be, for example, one of a transparent glass substrate, a transparent plastic substrate, and a silicon wafer substrate. In addition, the substrate 100 is mounted in a head mounted display device, and may be made of a flexible material that is flexible in response to the curvature of a reception unit of the head mounted display device.

Also, in the case in which the substrate 100 directly corresponds to both eyes and is applied to a head mounted display device corresponding to the case in which the viewer watches an augmented reality image, the substrate 100 is preferably transparent.

In the case in which the substrate 100 directly corresponds to both eyes and is applied to a head mounted display device corresponding to the case in which the viewer watches a virtual reality image, the substrate 100 may not be transparent.

In the case in which the substrate 100 does not directly correspond to both eyes and is received in a head mounted display device so as to correspond to the outside of both eyes, the substrate 100 is preferably not transparent.

Here, each driving thin film transistor 310 is electrically connected to the first electrode 120.

In the shown example, a reflective plate 217 is formed of a reflective electrode, and the first electrode and the reflective plate 217 are electrically conducted to each other. Depending on circumstances, however, the reflective plate 217 may optically use reflectivity and thus does not have electrical conductivity, and may not be electrically connected to the first electrode 120.

For the second subpixel G-S and the third subpixel R-S, a first transparent inorganic film 115a and a second transparent inorganic film 115b may be further provided between the reflective plate 217 and the first electrode 120 in order to adjust the distance between the lower surface of the reflective plate 217 and a second electrode 200.

The driving thin film transistor 310 may include a semiconductor layer 311 provided in a predetermined area of the buffer layer, a gate electrode 312 provided on the semiconductor layer 311, the gate electrode 312 partially overlapping the semiconductor layer 311 via a gate dielectric film 102, and a source electrode 313 and a drain electrode 314 connected to opposite sides of the semiconductor layer 311.

In the shown example, a top gate structure in which the gate electrode 312 is located above the semiconductor layer 311 is provided. However, the present disclosure is not limited thereto, and a bottom gate structure in which the gate electrode is located below the semiconductor layer may be provided.

In addition, the semiconductor layer 311 may be constituted by a polysilicon semiconductor layer, an amorphous semiconductor layer, an oxide semiconductor layer, or a combination of some thereof. Depending on circumstances, the semiconductor layer may be realized such that only the portion thereof excluding a channel is crystalline.

In addition, an interlayer dielectric film 103 configured to cover the gate electrode 312 and to correspond to lower parts of the source electrode 313 and the drain electrode 314 is further provided on the gate dielectric film 102, and an inorganic passivation film 104 and an organic passivation film 105 configured to cover the source electrode 313 and the drain electrode 314 are sequentially formed on the gate electrode 312.

The source electrode 313 and the drain electrode 314 are connected to the semiconductor layer located thereunder via contact holes CT provided in the interlayer dielectric film 103 and the gate dielectric film 102.

The organic passivation film 105 is formed to have a thickness of 1 µm or more to the extent offsetting the step of the construction thereunder, and the surface thereof may be flat.

The reflective plate 217 is made of aluminum (Al), an aluminum alloy, silver, a silver alloy, or APC and thus is conductive, and is connected to the drain electrode 314 via contact holes formed in the organic passivation film 105 and the inorganic passivation film 104.

In the display panel according to the present disclosure, light-emitting portions BEM, GEM, and REM may be divided by a bank 125 surrounding each light-emitting portion. Between adjacent subpixels, the organic passivation film 105 and the color compensation layer, respectively, may be removed to form contact holes CT1 and CT2 corresponding to the bank 125. By the contact holes CT1 and CT2, the first electrode 120, and the reflective plate 217 are electrically connected to the driving thin film transistor 310. In the display panel according to the present disclosure, a width of bank 125 may be reduced and deposition efficiency of an organic material corresponding to vertical portions of the bank 125 may be reduced when a plurality of organic layers constituting the white organic light-emitting stack WEL is formed irrespective of division between the subpixels. Thus, by a structure of the bank 125, organic material may be limited at each edge of the subpixel in a miniaturized and highly integrated device.

In addition, the bank 125 is made of an inorganic film, such as an oxide film (SiOx) or a nitride film (SiNx). The reason for this is that, when the bank 125 is made of an organic material, microscale line width control is difficult. In the case in which the bank 125 is made of an inorganic film, line width may be adjusted to less than a few µm, and nano line width adjustment is also possible in the case of high resolution.

The structures of the white organic light-emitting stack WEL, the second electrode 120, a capping layer 300, an encapsulation layer 350, first to third color filter layers 410, 420, and 430, the first electrode 120, the reflective plate 217, and a color compensation layer 190 provided in the subpixels B-S, G-S, and R-S are the same as those described above.

The light-emitting portions BEM, GEM, and REM of the subpixels may be defined in the inner area of the back 125.

The display panel according to the present disclosure described above has a microcavity structure capable of enhancing all of the red, green, and blue wavelengths, wherein a white subpixel having no filter unit is further provided in addition to the red, green, and blue subpixels, whereby panel efficiency is further improved. Also, in the display panel according to the present disclosure, the thickness of the color compensation layer and the panel efficiency are equally applied by subpixel in the case in which no white subpixel is provided in a structure in which the distances between the reflective plate and the first electrode are different from each other in the red, green, and blue subpixels, whereby the structure is simplified, the process is simplified, and the color expression limit is overcome.

In the display panel according to the present disclosure, a silicon wafer may be used as the substrate 100. In this case, a strong cavity structure is applied for high luminance and high efficiency of a product. For a peak property distinctly distinguished with the respective light-emitting color wavelengths, i.e. a strong cavity property, the thickness between the reflective plate and the first electrode is formed so as to be greater than the thickness of the white organic light-emitting stack to secure sufficient constructive interference distance for reflected light by wavelength such that constructive interference is possible for all of red, green, and blue when microscale resonance is generated between the reflective plate and the second electrode.

In the display panel according to the present disclosure, layer deposition from the reflective plate to the second electrode is possible with respect to all subpixels provided in the active area, including the white subpixel as well as the red, green, and blue subpixels, without necessity of division by subpixel, whereby it is possible to configure an organic light-emitting device array that does not use an FMM in order to realize an ultrahigh-resolution product. The inventors of the present application have confirmed that it is possible to realize a high-resolution display panel having 3000 ppi or more.

Particular, in the display panel according to the present disclosure, in order to adjust cavity length for different wavelengths of red, green, and blue, a color compensation layer (a cavity control layer) is provided between the reflective plate and the first electrode such that the cavity length by wavelength between the reflective plate and the second electrode has a common multiple relationship. As a result, it is possible to form the white organic light-emitting stack using a common mask open for all of the subpixels without providing a fine metal mask (FMM) in the deposition process between the first electrode and the second electrode as well as the color compensation layer.

In addition, the light transmitted through the second electrode via the white organic light-emitting stack has three white spectrum properties that are distinctly distinguished, whereby the red, green, and blue subpixels may selectively transmit red, green, and blue light with high color gamut, and at the same time the white subpixel having no filter unit transmits white spectrum light having three color peak properties, whereby it is possible to improve panel luminance and panel efficiency. In an ultrahigh-resolution structure, therefore, vivid display may be realized.

Hereinafter, various forms of a head mounted display device to which the organic light-emitting device array is applied and to which the display panel having the organic light-emitting device array applied thereto is applied will be described.

The head mounted display device may have a glasses type, helmet type, or band type external appearance.

Figure 15:
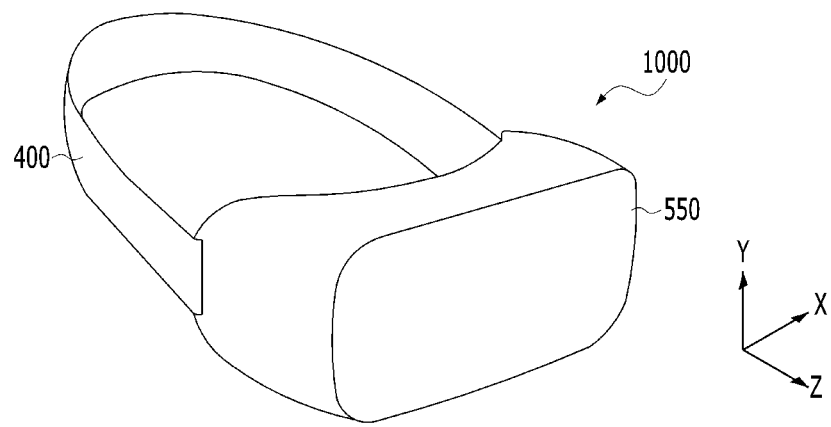
FIG. 15 is a perspective view of a head mounted display device according to a first form of the present disclosure according to one embodiment.
Figure 16:
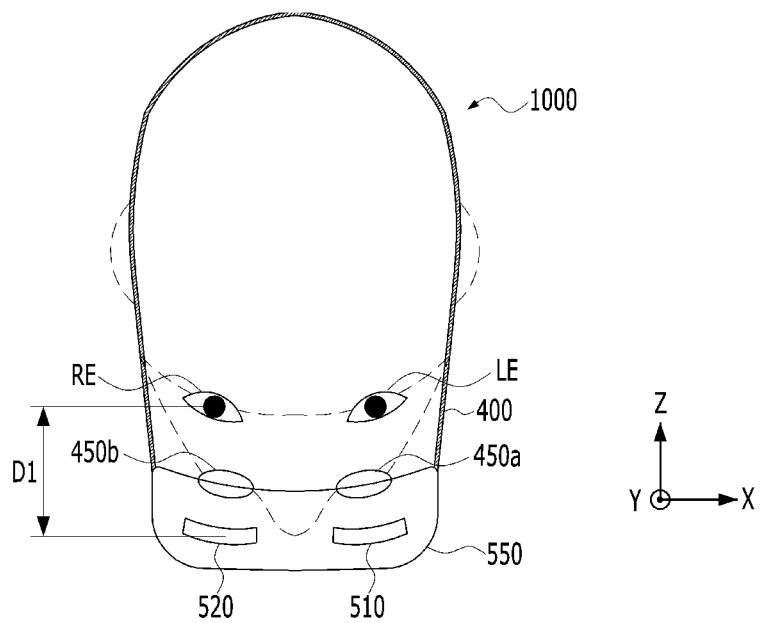
FIG. 16 is a plan view of FIG. 15 according to one embodiment.

FIG. 15 is a perspective view of a head mounted display device according to a first form of the present disclosure, and FIG. 16 is a plan view of FIG. 15.

As shown in FIGS. 15 and 16, the head mounted display device 1000 according to the first form of the present disclosure has a form capable of watching virtual reality, and is shown as a band type.

The display device includes a reception structure 550 in which a first display panel 510 and a second display panel 520 corresponding to both eyes LE and RE of a viewer are received, and first and second lens units 450a and 450b located between the first display panel 510 and the second display panel 520 and both eyes LE and RE of the viewer to converge images on both eyes of the viewer.

In this case, the head mounted display device 1000 moves together with the head of the viewer even when the head moves, and therefore the vertical distance between the first and second display panels 510 and 520 and both eyes LE and RE of the viewer is uniform irrespective of the motion of the viewer.

Since the point of view is fixed when the left eye LE looks at the first display panel 510 and the right eye RE looks at the second display panel 520, therefore, it is possible for the left eye and the right eye to watch images output from the first and second display panels 510 and 520 without deviation.

Figure 17:
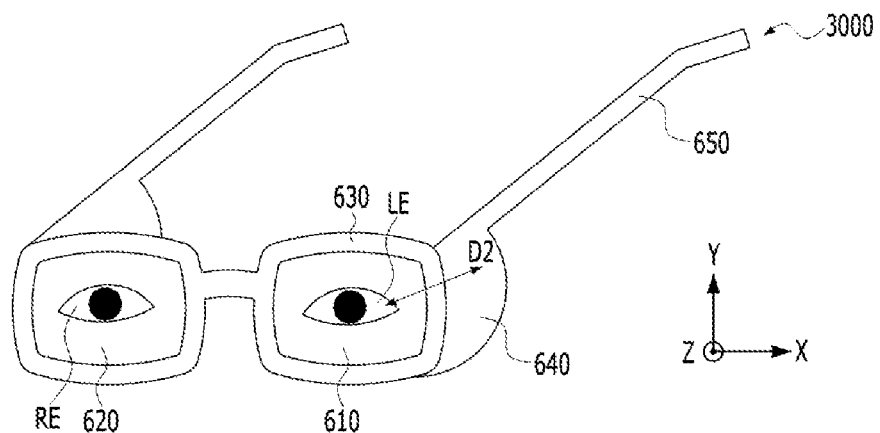
FIG. 17 is a perspective view of a head mounted display device according to a second form of the present disclosure according to one embodiment.
Figure 18:
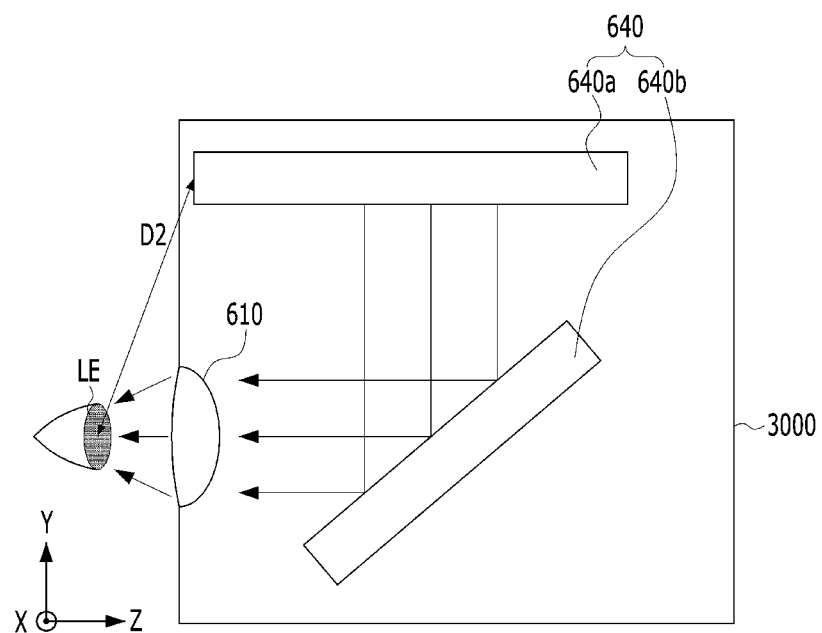
FIG. 18 is a view showing a relationship between the head mounted display device of FIG. 17 and the eyes of a viewer according to one embodiment.

FIG. 17 is a perspective view of a head mounted display device 3000 according to a second form of the present invention, and FIG. 18 is a view showing a relationship between the head mounted display device of FIG. 17 and the eyes of a viewer.

As shown in FIGS. 17 and 18, the head mounted display device 3000 according to the second form of the present invention has a form corresponding to augmented reality, in which a transparent lens unit 610 and 620 is provided at the front at which both eyes LE and RE look in order to see an external environment, e.g. a glasses type form. However, the present invention is not limited thereto. Even in a helmet or band type form, the transparent lens unit 610 and 620 may be provided at the front at which both eyes LE and RE look in order to watch augmented reality while viewing the external environment.

The head mounted display device 3000 according to the second form of the present invention includes a transparent lens unit disposed at the front at which both eyes LE and RE look, the transparent lens unit including first and second transparent lens 610 and 620, a reception structure 650 configured to wrap the first and second transparent lenses 610 and 620 in the form of a frame 630, the reception structure being disposed at opposite sides of both eyes LE and RE of the viewer so as to be put on both ears of the viewer.

In addition, an image transmission unit 640 including a display panel 640a located spaced apart from opposite sides of both eyes LE and RE of the viewer by the same squint distance D2 and a mirror reflector 640b configured to transmit an image output from the display panel 640a to the transparent lens unit 610 and 620 is mounted at the reception structure 650.

A display panel according to the present invention may include a substrate having a plurality of subpixels, a reflective plate provided on the substrate over the subpixels, a color compensation layer provided on the reflective plate over the subpixels, a first electrode provided on the color compensation layer for each of the subpixels, a second electrode provided above the first electrode, a white organic light-emitting stack provided between the first electrode and the second electrode, the white organic light-emitting stack comprising emissive layers configured to emit at least different colors of light, and a color filter layer provided on the second electrode for at least one of the subpixels.

The color compensation layer may be thicker than the white organic light-emitting stack and thinner than the substrate.

The color compensation layer may be made of an inorganic dielectric material.

The color compensation layer may adjust a reflection light path between the reflective plate and the first electrode.

The white organic light-emitting stack may generate first light that is transmitted to the second electrode and second light that advances toward the first electrode, the second light may reflected by the surface of the reflective plate and thus may be converted into reflected light, the reflected light advancing via the color compensation layer, the first electrode, the white organic light-emitting stack, and the second electrode, and the first light and the reflected light may have a constructive interference relationship at red, green, and blue wavelengths.

The substrate may include a thin film transistor electrically connected to the reflective plate or the first electrode for each subpixel, the thin film transistor may include a semiconductor layer and at least one source electrode connected to the semiconductor layer, the display panel may include an interlayer dielectric film provided between the semiconductor layer and the source electrode excluding the semiconductor layer and a portion connected to the semiconductor layer, and the display panel may further include a first dielectric film provided between the substrate and the thin film transistor and a second dielectric film provided between the thin film transistor and the reflective plate.

The color compensation layer may include a same material (identical material) to at least one of the interlayer dielectric film, the first dielectric film, or the second dielectric film.

The first electrode may be a transparent electrode, and the second electrode may be a transflective electrode.

The color compensation layer may have an identical thickness for the subpixels.

The white organic light-emitting stack may further include a first stack including a first hole transport layer and a blue emissive layer, a second stack including a red emissive layer and a green emissive layer, and a charge generation layer provided between the first stack and the second stack.

The display panel may further include a first electron transport layer provided between the blue emissive layer and the charge generation layer, a second hole transport layer provided between the charge generation layer and the red emissive layer, and a second electron transport layer provided between the green emissive layer and the second electrode.

The display panel may further include a capping layer and an encapsulation layer provided between the second electrode and the color filter layer.

The plurality of subpixels may include a red subpixel, a green subpixel, a blue subpixel, and a white subpixel, and the color filter layer may include a red color filter, a green color filter, and a blue color filter configured to selectively transmit red, green, and blue wavelengths, among wavelengths having the constructive interference relationship between the first light and the reflected light, for the red, green, and blue subpixels.

The display panel may further include a transparent organic layer provided in the same plane as the color filter layer of the white subpixel.

In addition, a head mounted display device according to another embodiment of the present invention may include the display panel and a reception structure configured to receive the display panel.

The display panel may include a first display panel and a second display panel divided from each other, and the first display panel and the second display panel may correspond to the left eye and the right eye of a viewer, respectively.

The head mounted display device may further include first and second lens units provided between the first display panel and the left eye of the viewer and between the second display panel and the right eye of the viewer, respectively, the first and second lens units being configured to converge images on the left eye and the right eye of the viewer, respectively.

The first and second display panels may be provided so as to correspond to sides of the left eye and the right eye of the viewer, respectively, in the reception structure, and the head mounted display device may further include first and second mirror reflectors configured to reflect images output from the first and second display panels and first and second lens units configured to converge images output from the first and second mirror reflectors to the left eye and the right eye of the viewer, respectively.

The substrate may be one of a transparent glass substrate, a transparent plastic substrate, and a silicon substrate.

The display panel according to the present invention and the head mounted display device including the same have the following effects.

First, in the display panel according to the present disclosure and the head mounted display device including the same, the white organic light-emitting stack is provided between the first electrode and the second electrode, and the color compensation layer having a sufficient thickness is provided between the first electrode and the reflective plate, whereby light transmitted through the second electrode has constructive interference for all of red, green, and blue. Consequently, it is possible to express three-peak white through resonance action by wavelength including reflection and re-reflection using only the construction including the reflective plate, the second electrode, and the color compensation layer and the white organic light-emitting stack therebetween. In this case, no filter is provided above the second electrode, and the area configured to transmit light from the white organic light-emitting stack in the state of having three-peak white is provided, whereby it is possible to realize the white subpixel. That is, when light generated in the white organic light-emitting stack between the first electrode and the second electrode is emitted through reflection and re-reflection between the reflective plate below the first electrode and the second electrode, the thickness of the color compensation layer between the reflective plate and the second electrode is set such that three different wavelengths constructively interfere with each other, whereby it is possible to realize white including three peaks within a visible light range through the area having no filter unit in addition to realization of a selective wavelength of red, green, and blue through the filter unit.

Second, in the display panel according to the present disclosure and a head mounted display device including the same, the color compensation layer provided between the reflective plate and the first electrode may have the same thickness at different color subpixels and the white subpixel, whereby constructive interference between different wavelengths of light is simultaneously possible. In this case, the color compensation layer does not generate a step for each of the subpixels, whereby a process of forming contact holes through the color compensation layer between the first electrode and the thin film transistor is unified, whereby it is possible to simplify the process.

Third, the color compensation layer between the reflective plate and the first electrode is formed so as to be thicker than the white organic light-emitting stack, whereby microscale resonance is possible with respect to wavelengths of red, green, and blue, and when the reflected light advancing area is adjusted such that light is emitted through the second electrode, expression of white including three color peaks is possible without filtering at the transmission unit having no color filter, whereby panel efficiency may also be improved.

Fourth, no step is generated in the structure below the second electrode at each subpixel. In the construction located above the thin film transistor, therefore, the use of a mask necessary to divide the area into the subpixels is reduced or omitted, whereby it is possible to realize a high-resolution small-sized panel. In particular, when forming the color compensation layer, the white organic light-emitting stack, or the second electrode, a common mask having an opening is used with respect to all of the subpixels even when there is an interference phenomenon during a deposition process, the edge of the opening of the common mask is located outside the active area including all of the subpixels, whereby each of the subpixels is not affected by an interference phenomenon due to a deposition material and thus it is possible to realize high resolution with high precision.

It will be apparent to those skilled in the art that the present disclosure described above is not limited to the above embodiments and the accompanying drawings and that various substitutions, modifications, and variations can be made without departing from the technical idea of the present invention.

What is claimed is:

1. A display panel comprising:
   a substrate having a plurality of subpixels;
   a reflective plate on the substrate;
   a color compensation layer on the reflective plate;
   a first electrode on the color compensation layer for each of the plurality of subpixels;
   a second electrode above the first electrode;
   a white organic light-emitting stack between the first electrode and the second electrode, the white organic light-emitting stack comprising emissive layers configured to emit at least different colors of light; and
   a filter unit and a transmission unit on the second electrode, the filter unit being configured to selectively transmit some wavelengths of light, among light emitted through the white organic light-emitting stack, the transmission unit being configured to transmit all wavelengths of light emitted through the white organic light-emitting stack,
   wherein the color compensation layer adjusts a reflection light path between the reflective plate and the first electrode.

2. The display panel according to claim 1, wherein the color compensation layer is thicker than the white organic light-emitting stack and the color compensation layer is thinner than the substrate.

3. The display panel according to claim 1, wherein the color compensation layer is made of an inorganic dielectric material.

4. The display panel according to claim 1, wherein
   the white organic light-emitting stack generates first light that is transmitted to the second electrode and second light that advances toward the first electrode,
   the second light is reflected by a surface of the reflective plate and is converted into reflected light, the reflected light advancing via the color compensation layer, the first electrode, the white organic light-emitting stack, and the second electrode, and
   the first light and the reflected light are transmitted through the second electrode while having a constructive interference relationship at red, green, and blue wavelengths.

5. The display panel according to claim 4, wherein
   the plurality of subpixels comprises a red subpixel, a green subpixel, a blue subpixel, and a white subpixel, and
   the filter unit comprises a red color filter, a green color filter, and a blue color filter configured to selectively transmit red, green, and blue wavelengths, among wavelengths having the constructive interference relationship between the first light and the reflected light, for the red, green, and blue subpixels.

6. The display panel according to claim 5, further comprising:
   a transparent organic layer in the transmission unit of the white subpixel, the transparent organic layer being disposed in a same plane to the red, green, and blue color filters.

7. The display panel according to claim 1,
   wherein the substrate comprises a thin film transistor electrically connected to the reflective plate or the first electrode for each subpixel, and
   the thin film transistor comprises a semiconductor layer and at least one source electrode connected to the semiconductor layer, and
   further comprising an interlayer dielectric film between the semiconductor layer and a layer of the source electrode except a contact portion, a first dielectric film between the substrate and the thin film transistor and a second dielectric film between the thin film transistor and the reflective plate.

8. The display panel according to claim 7, wherein the color compensation layer comprises a same material as at least one of the interlayer dielectric film, the first dielectric film, or the second dielectric film.

9. The display panel according to claim 1, wherein
   the first electrode is a transparent electrode, and
   the second electrode is a transflective electrode.

10. The display panel according to claim 1, wherein
    the reflective plate and the color compensation layer are provided at all subpixels on the substrate, and
    the color compensation layer has an identical thickness for the subpixels.

11. The display panel according to claim 1, wherein the white organic light-emitting stack further comprises:
    a first stack comprising a first hole transport layer and a blue emissive layer;
    a second stack comprising a red emissive layer and a green emissive layer; and
    a charge generation layer between the first stack and the second stack.

12. The display panel according to claim 11, further comprising:
    a first electron transport layer between the blue emissive layer and the charge generation layer;
    a second hole transport layer between the charge generation layer and the red emissive layer; and
    a second electron transport layer between the green emissive layer and the second electrode.

13. The display panel according to claim 1, further comprising a capping layer and an encapsulation layer between the second electrode and the filter unit, each of the capping layer and the encapsulation layer having a larger area than the second electrode.

14. A head mounted display device comprising:
a display panel comprising a substrate having a plurality of subpixels, a reflective plate on the substrate, a color compensation layer on the reflective plate, a first electrode on the color compensation layer for each of the plurality of subpixels, a second electrode above the first electrode, a white organic light-emitting stack between the first electrode and the second electrode, the white organic light-emitting stack comprising emissive layers configured to emit at least different colors of light and a filter unit and a transmission unit on the second electrode, the filter unit being configured to selectively transmit some wavelengths of light, among light emitted through the white organic light-emitting stack, the transmission unit being configured to transmit all wavelengths of light emitted through the white organic light-emitting stack; and
a reception structure configured to receive the display panel,
wherein the color compensation layer adjusts a reflection light path between the reflective plate and the first electrode.

15. The head mounted display device according to claim 14, wherein
the display panel comprises a first display panel and a second display panel divided from each other, and
the first display panel and the second display panel correspond to a left eye and a right eye of a viewer, respectively.

16. The head mounted display device according to claim 15, further comprising:
first and second lens units between the first display panel and the left eye of the viewer and between the second display panel and the right eye of the viewer, respectively, the first and second lens units being configured to converge images on the left eye and the right eye of the viewer, respectively.

17. The head mounted display device according to claim 15, wherein
the first and second display panels are provided so as to correspond to sides of the left eye and the right eye of the viewer, respectively, in the reception structure, and
the head mounted display device further comprises:
first and second mirror reflectors configured to reflect images output from the first and second display panels; and
first and second lens units configured to converge images output from the first and second mirror reflectors to the left eye and the right eye of the viewer, respectively.

18. The head mounted display device according to claim 14, wherein the substrate is one of a transparent glass substrate, a transparent plastic substrate, or a silicon substrate.

19. The head mounted display device according to claim 14,
wherein the color compensation layer is thicker than the white organic light-emitting stack and the color compensation layer is thinner than the substrate or
wherein the color compensation layer is uniformly positioned between the reflective plate and the first electrode over the plurality of subpixels.

* * * * *